(12) United States Patent
Ryu et al.

(10) Patent No.: US 11,632,863 B2
(45) Date of Patent: Apr. 18, 2023

(54) DISPLAY DEVICE AND APPARATUS AND METHOD OF MANUFACTURING THE SAME

(71) Applicants: SAMSUNG DISPLAY CO., LTD., Yongin-si (KR); YUIL Co., Ltd., Bucheon-si (KR)

(72) Inventors: Dohyung Ryu, Yongin-si (KR); Yonggil Ryu, Buchen-si (KR); Wonju Kim, Yongin-si (KR); Wuhyeon Jung, Yongin-si (KR); Daehyun Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 143 days.

(21) Appl. No.: 16/877,562

(22) Filed: May 19, 2020

(65) Prior Publication Data
US 2020/0396849 A1   Dec. 17, 2020

(30) Foreign Application Priority Data
Jun. 13, 2019   (KR) ........................ 10-2019-0070066

(51) Int. Cl.
| | | |
|---|---|---|
| H05K 5/02 | (2006.01) | |
| H05K 5/00 | (2006.01) | |
| H01L 51/56 | (2006.01) | |
| H05K 5/03 | (2006.01) | |
| H01L 27/32 | (2006.01) | |
| H01L 51/52 | (2006.01) | |

(52) U.S. Cl.
CPC .......... *H05K 5/0017* (2013.01); *H01L 51/56* (2013.01); *H05K 5/03* (2013.01); *H01L 27/3244* (2013.01); *H01L 51/5237* (2013.01); *H01L 2251/5338* (2013.01)

(58) Field of Classification Search
CPC combination set(s) only.
See application file for complete search history.

(56) References Cited

U.S. PATENT DOCUMENTS

| | | | |
|---|---|---|---|
| 2016/0066412 A1* | 3/2016 | Choi | ..................... G06F 1/1601 361/749 |
| 2017/0042046 A1 | 2/2017 | Lee et al. | |
| 2017/0113397 A1 | 4/2017 | Seo et al. | |
| 2017/0263492 A1 | 9/2017 | Son et al. | |

(Continued)

FOREIGN PATENT DOCUMENTS

| | | |
|---|---|---|
| JP | 9117480 A | 5/1997 |
| JP | H9117480 A | 5/1997 |

(Continued)

OTHER PUBLICATIONS

Extended European Search Report for Application No. 20176397.6 dated Mar. 2, 2021.

(Continued)

*Primary Examiner* — Hung S. Bui
(74) *Attorney, Agent, or Firm* — Cantor Colburn LLP

(57) ABSTRACT

A display device includes a cover member which is at least partially bent, a panel member arranged along a surface of the cover member, where the panel member displays an image, and a support member arranged on another surface of the panel member different from the surface of the panel member on which the cover member is arranged.

26 Claims, 20 Drawing Sheets

(56) References Cited

U.S. PATENT DOCUMENTS

| | | | |
|---|---|---|---|
| 2018/0088631 A1* | 3/2018 | Park | G06F 3/041 |
| 2018/0183002 A1* | 6/2018 | Kawata | B32B 7/12 |
| 2019/0129553 A1 | 5/2019 | Oh et al. | |

FOREIGN PATENT DOCUMENTS

| | | | |
|---|---|---|---|
| JP | 2015214033 A | 12/2015 |
| JP | 6004296 81 | 10/2016 |
| JP | 6004296 B1 | 10/2016 |
| KR | 101406167 B1 | 6/2014 |
| KR | 1020150030990 A | 3/2015 |
| KR | 1020160042878 A | 4/2016 |
| KR | 101689568 B1 | 12/2016 |
| KR | 1020170013574 A | 2/2017 |
| KR | 101738411 B1 | 5/2017 |
| KR | 1020190047168 A | 5/2019 |

OTHER PUBLICATIONS

European partial search report for application No. 20176397.6 dated Nov. 16, 2020.

* cited by examiner

DISPLAY DEVICE AND APPARATUS AND METHOD OF MANUFACTURING THE SAME

This application claims priority to Korean Patent Application No. 10-2019-0070066, filed on Jun. 13, 2019, and all the benefits accruing therefrom under 35 U.S.C. 119, the content of which in its entirety is herein incorporated by reference.

BACKGROUND

1. Field

One or more embodiments relate to an apparatus and a method, and more particularly, to a display device, an apparatus for manufacturing the display device and a method of manufacturing the display device.

2. Description of the Related Art

Mobile electronic devices, e.g., tablet personal computers ("PC"s) as well as small electronic devices such as mobile phones, have been widely used.

Mobile electronic devices typically include display devices for providing visual information such as images to users to support various functions. Recently, as the size of components for driving display devices have been reduced, the size of the display devices in mobile electronic devices have gradually increased and the display devices may have structures to be bendable by predetermined angles from flat states.

SUMMARY

One or more embodiments include a partially curved display device, an apparatus for manufacturing the display device and a method of manufacturing the display device with reduced defects.

According to an embodiment, a display device includes: a cover member which is at least partially bent; a panel member arranged along a surface of the cover member, where the panel member displays an image; and a support member arranged on another surface of the panel member different from the one surface of the panel member on which the cover member is arranged.

In an embodiment, the image displayed on the panel member may be visible through the cover member.

In an embodiment, the display device may include a first region which is flat, and a second region connected to an end of the first region, where the second region may be curved.

In an embodiment, the display device may further include a third region connected to the first region and arranged opposite to the second region with respect to the first region.

In an embodiment, a shape of the second region may be different from a shape of the third region.

In an embodiment, a distance from a surface of the first region to an end of the second region may be different from a distance from the surface of the first region to an end of the third region.

In an embodiment, a position of an end of the cover member, a position of an end of the panel member, and a position of an end of the support member may be different from one another.

In an embodiment, the panel member may be flexible.

In an embodiment, the display device may have a long side and a short side in a plane view.

In an embodiment, a curved portion of the cover member may be defined in a portion extending along the long side of the display device.

According to an embodiment, an apparatus for manufacturing a display device includes: a first jig portion including a first support portion and a first pressing portion arranged at the first support portion, where the first pressing portion presses a support member; a second jig portion including a linear movement portion corresponding to the first pressing portion, where the linear movement portion linearly moves, and the second jig portion faces the first jig portion and the support member is seated on the second jig portion; and a third jig portion arranged on a side surface of the second jig portion to press a side surface of the support member when the support member is molded. In such an embodiment, at least one of the first jig portion and the second jig portion linearly moves, and the linear movement portion linearly moves together with the first pressing portion when at least one of the first jig portion and the second jig portion linearly moves.

In an embodiment, the first jig portion may further include a first protrusion portion arranged at the first pressing portion and protruding toward the second jig portion.

In an embodiment, the first pressing portion may include a pressing body portion connected to the first support portion, and a protrusion portion protruding from the pressing body portion toward a side surface of the pressing body portion.

In an embodiment, the first jig portion may further include a first heating portion arranged inside the first support portion.

In an embodiment, the first jig portion may further include a first temperature measuring portion arranged inside the first support portion to measure a temperature of the first support portion.

In an embodiment, the first jig portion may further include a first guide portion arranged at the first support portion.

In an embodiment, the second jig portion may further include a second guide portion arranged to correspond to the first guide portion to guide a movement of the first jig portion.

In an embodiment, the second jig portion may further include a second support portion in which the linear movement portion linearly moves.

In an embodiment, the second jig portion may further include a third guide portion which guides a movement of the third jig portion.

In an embodiment, the second jig portion may further include an elastic portion which provides a restoring force to the linear movement portion during movement of the linear movement portion.

In an embodiment, the third jig portion may include a second pressing portion which linearly moves in the second jig portion to press the side surface of the support member.

In an embodiment, the second pressing portion may include a curved portion which bends at least a portion of the support member.

In an embodiment, the third jig portion may further include a driver connected to the second pressing portion to linearly move the second pressing portion.

In an embodiment, the third jig portion may further include a heat insulating member arranged between the driver and the second pressing portion.

In an embodiment, the third jig portion may further include a second heating portion arranged inside the second pressing portion.

In an embodiment, the third jig portion may further include a second temperature measuring portion arranged inside the second pressing portion.

In an embodiment, the third jig portion may further include a second protrusion portion arranged at the second pressing portion to maintain a distance between the third jig portion and the second jig portion.

According to an embodiment, a method of manufacturing a display device includes: seating a support member on a second jig portion; pressing the support member by a pressing portion of a first jig portion; bending a portion of an end of the support member by linearly moving a linear movement portion of the second jig portion and the support member together; and pressing, by a third jig portion, the bent portion of the end of the support member to bend the portion of the end of the support member again.

In an embodiment, the method may further include heating the bent portion of the end of the support member.

In an embodiment, at least one of an upper surface of the support member and a side surface of the support member may be heated.

In an embodiment, a lower surface of the pressing portion and an upper surface of the linear movement portion may be maintained to be spaced apart from each other with a gap when the support member is pressed by the first jig portion.

In an embodiment, a side surface of the third jig portion and a side surface of the linear movement portion may be maintained to be spaced apart from each other with a gap when a side surface of the support member is pressed by the third jig portion.

In an embodiment, the pressing portion may bend the portion of the end of the support member at a first angle, and the third jig portion may bend the portion of the end of the support member at a second angle different from the first angle.

In an embodiment, the second angle may be greater than the first angle.

In an embodiment, the second jig portion may pneumatically adsorb the support member.

In an embodiment, the method may further include attaching the support member to a cover member and a panel member of the display device.

In an embodiment, at least a portion of the cover member may be bent.

In an embodiment, the cover member may include a flat portion and a bent portion, where the support member may be sequentially attached to the panel member from the flat portion of the cover member to the bent portion of the cover member.

In an embodiment, the method may further include removing a film member of the support member.

Other features of embodiments of the invention will become apparent from the following drawings, claims, and detailed description of the disclosure.

Such features may be implemented by using a system, a method, a computer program, or a combination of a system, a method, and a computer program.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1A:
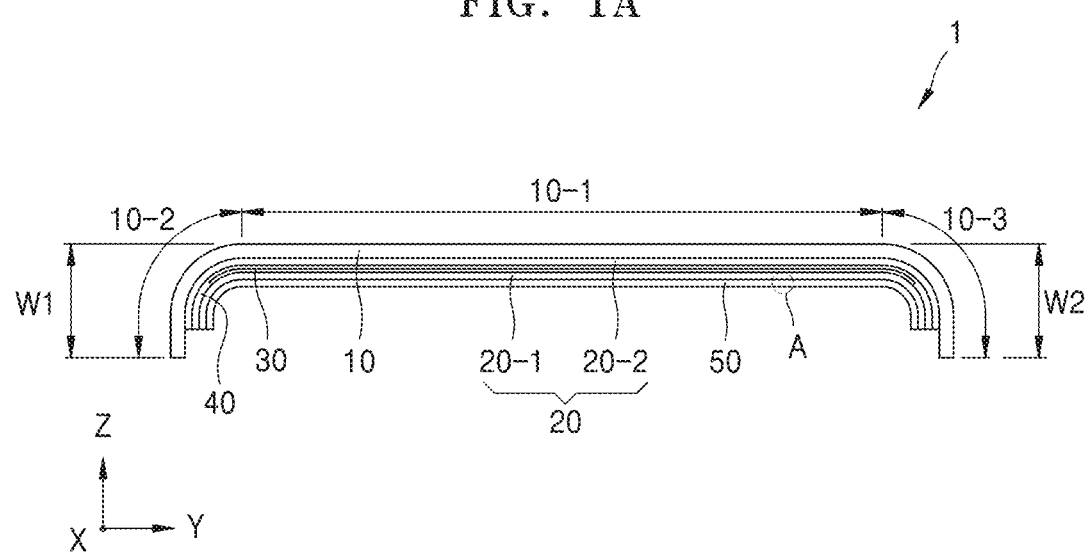
FIG. 1A is a cross-sectional view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout and thus any repetitive detailed description thereof will may be omitted or simplified.

It will be understood that when an element is referred to as being "on" another element, it can be directly on the other element or intervening elements may be present therebetween. In contrast, when an element is referred to as being "directly on" another element, there are no intervening elements present.

It will be understood that although the terms "first", "second", etc. may be used herein to describe various components, these components should not be limited by these terms and are only used to distinguish one component from another. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

As used herein, the singular forms "a," "an" and "the" are intended to include the plural forms as well, unless the context clearly indicates otherwise. "Or" means "and/or." "At least one of A and B" means "at least one selected from A and B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Sizes of elements in the drawings may be exaggerated for convenience of explanation. Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Herein, the X-axis, the Y-axis and the Z-axis are not limited to three axes of the rectangular coordinate system, and may be interpreted in a broader sense. For example, the X-axis, the Y-axis, and the Z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Hereinafter, embodiments of the invention will be described in detail with reference to the accompanying drawings.

Figure 1B:
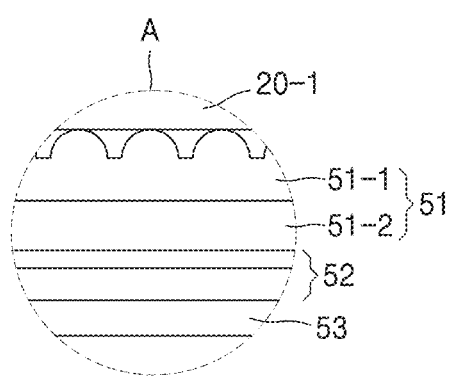
FIG. 1B is an enlarged view of the encircled portion of FIG. 1A.
Figure 2:
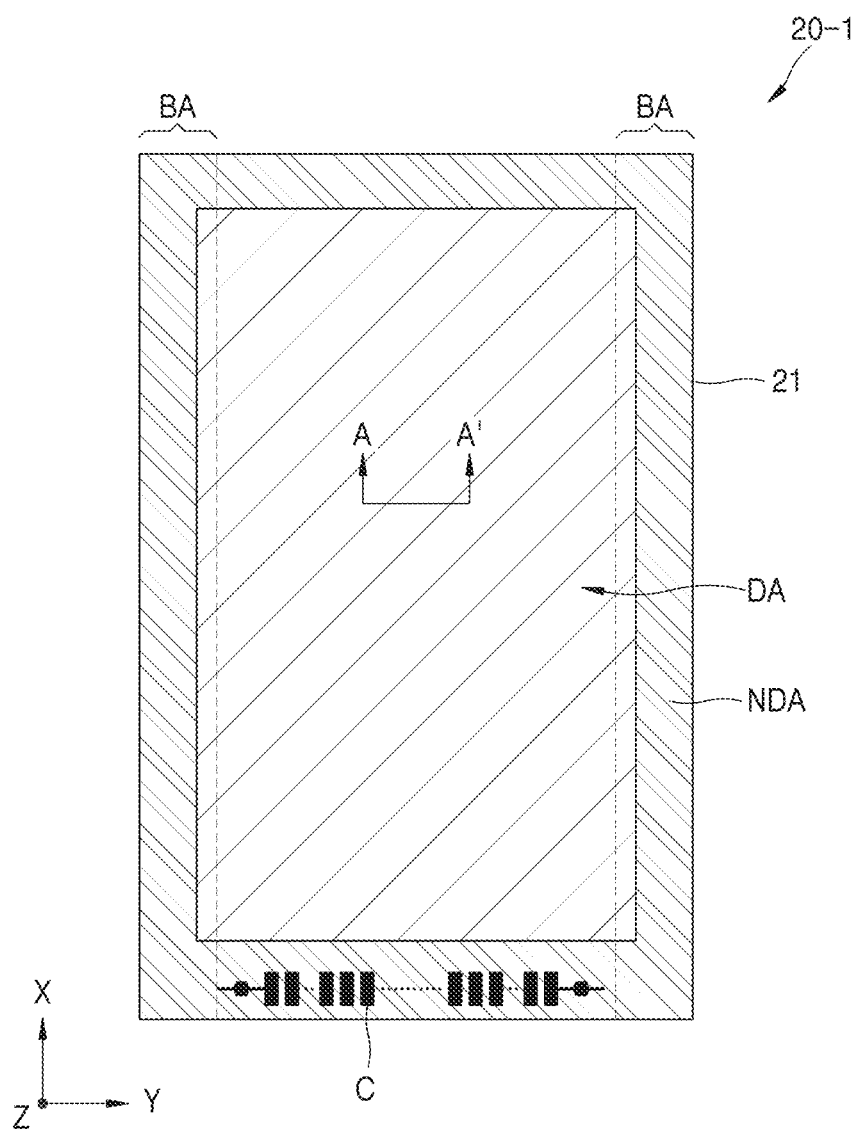
FIG. 2 is a plan view of a display panel shown in FIG. 1A.
Figure 3:
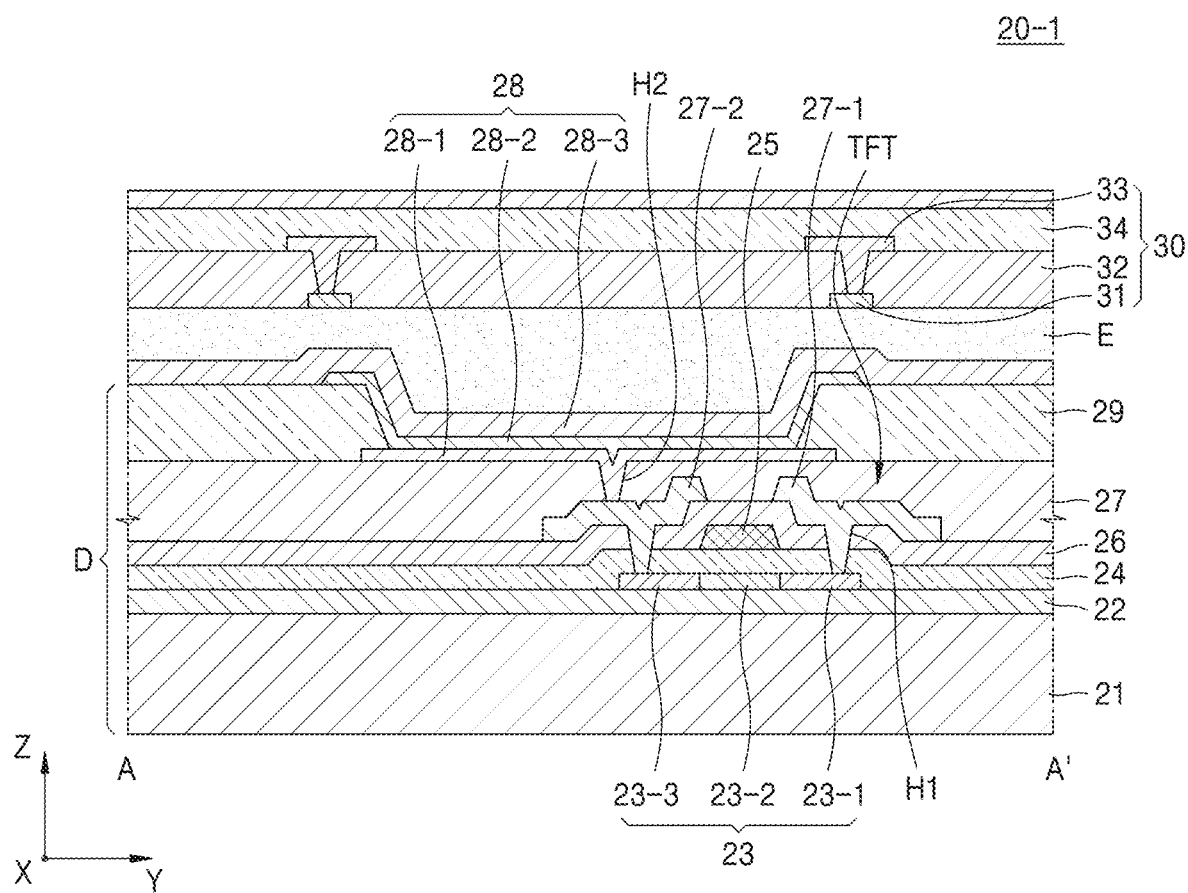
FIG. 3 is a cross-sectional view taken along line A-A' of FIG. 2.

FIG. 1A is a cross-sectional view of a display device 1 according to an embodiment. FIG. 1B is an enlarged view of the encircled portion of FIG. 1A. FIG. 2 is a plan view of a display panel 20-1 shown in FIG. 1A. FIG. 3 is a cross-sectional view taken along line A-A' of FIG. 2.

FIGS. 1A to 3, an embodiment of the display device 1 may include a cover member 10, a panel member 20, and a support member 50.

In an embodiment, the cover member 10 may include a glass and/or a resin layer. In such an embodiment, the cover member 10 may transmit external light or an image displayed on a display panel 20-1 to allow the image is visible therethrough.

The cover member 10 may include a first region 10-1, which is flat, and a second region 10-2 and a third region 10-3 arranged at opposing ends of the first region 10-1. The first region 10-1, the second region 10-2, and the third region 10-3 may be arranged in a width direction (e.g., the Y-axis direction of FIG. 2) of the display panel 20-1. In an embodiment, the second region 10-2 and the third region 10-3 may be arranged in a long side portion (e.g., a bending area BA of the display panel 20-1) of the display panel 20-1. The bending area BA of the display panel 20-1 to be described below may be arranged on the long side of the display panel 20-1.

In an embodiment, the second region 10-2 and the third region 10-3 may be bent from the first region 10-1. The second region 10-2 and the third region 10-3 may include curved surfaces having a same radius of curvature as each other. In an alternative embodiment, the second region 10-2 and the third region 10-3 may include curved surfaces having different radii of curvature from each other. Hereinafter, for convenience of description, embodiments where the second region 10-2 and the third region 10-3 have curved surfaces having a same radius of curvature as each other will be described in detail.

In an embodiment, the length of the outer surface of the second region 10-2 may be equal to or different from the length of the outer surface of the third region 10-3. In one embodiment, for example, one of the length of the outer surface of the second region 10-2 and the length of the outer surface of the third region 10-3 may be greater than the other of the length of the outer surface of the second region 10-2 and the length of the outer surface of the third region 10-3. In such an embodiment, a first distance W1 from the upper surface of the first region 10-1 to one of the end of the second region 10-2 and the end of the third region 10-3 may be different from a second distance W2 from the upper surface of the first region 10-1 to the other of the end of the second region 10-2 and the end of the third region 10-3. Hereinafter, for convenience of description, the first distance W1 denotes a distance from the upper surface of the first region 10-1 to the end of the second region 10-2, and the second distance W2 denotes a distance from the upper surface of the first region 10-1 to the end of the third region 10-3. In an alternative embodiment, the length of the outer surface of the second region 10-2 and the length of the outer surface of the third region 10-3 may be equal to each other. In such an embodiment, the first distance W1 and the second distance W2 may be equal to each other.

An image may be displayed in the portions of the panel member 20 corresponding to the second region 10-2 and the third region 10-3.

The panel member 20 may be attached to the cover member 10. The panel member 20 may be flexible. The panel member 20 may display an image to the outside. The panel member 20 may be at least partially curved along the lower surface of the cover member 10. In one embodiment, for example, a portion of the panel member 20 in the first region 10-1 may be flat, like the lower surface of the cover member 10, and portions of the panel member 20 in at least one of the second region 10-2 and the third region 10-3 may be curved. In such an embodiment, the end of the panel member 20 may be arranged more inward than the end of the cover member 10. In such an embodiment, as shown in FIG. 1A, the end of the cover member 10 may further protrude from the end of the panel member 20 toward the lower surface of the cover member 10. In such an embodiment, since the panel member 20 is not arranged on a portion of the end of the cover member 10, a space where the cover member 10 may be coupled to another component (e.g., an external case) may be provided. In such an embodiment, even when the cover member 10 is coupled to the other component, the panel member 20 may be effectively prevented from being damaged due to a coupling force between the cover member 10 and the other component. In such an embodiment, since the end of the display panel 20-1, which is to be described below, of the panel member 20 is arranged between the cover member 10 and the other component when the cover member 10 and the other component are coupled to each other, a thin film encapsulation layer E and the like of the display panel 20-1 may be effectively prevented from being damaged.

The panel member 20 may include the display panel 20-1. In an embodiment of the display panel 20-1, as shown in FIG. 2, a display area DA and a non-display area NDA surrounding at least a side of the display area DA may be defined on a substrate 21. A light emitting portion may be arranged in the display area DA, and a power line (not shown) may be arranged in the non-display area NDA. In such an embodiment, a pad portion C may be arranged in the non-display area NDA.

The display panel 20-1 may include a portion of the display area DA and the non-display area NDA or a bending area BA including the non-display area NDA. The bending area BA may be arranged in a curved portion of the cover member 10. In one embodiment, for example, only the non-display area NDA may be arranged in the curved portion of the cover member 10. In an alternative embodiment, both a portion of the display area DA and the non-display area NDA may be arranged in the curved portion of the cover member 10. Hereinafter, for convenience of description, embodiments where a portion of the display area DA and the non-display area NDA are arranged in the curved portion of the cover member 10 will be mainly described in detail.

In an embodiment, as shown in FIG. 3, the display panel 20-1 may include the substrate 21, a thin film transistor TFT, a passivation layer 27, an organic light-emitting device 28, and a thin film encapsulation layer E.

The substrate 21 may include a plastic material, or may include a metal material such as stainless steel ("SUS") or titanium (Ti). In an embodiment, the substrate 21 may include polyimide ("PI"). Hereinafter, for convenience of description, embodiments where the substrate 21 includes PI will be mainly described in detail.

The thin film transistor TFT may be disposed or formed on the substrate 21, the passivation layer 27 may be disposed or formed to cover the thin film transistor TFT, and the organic light-emitting device 28 may be disposed or formed on the passivation layer 27.

A buffer layer 22 including an organic compound and/or an inorganic compound may be further disposed or formed on the upper surface of the substrate 21 and may include $SiO_x$, ($x≥1$) or $SiN_x$, ($x≥1$).

In an embodiment, after an active layer 23 is formed in a predetermined pattern on the buffer layer 22, the active layer 23 is covered by a gate insulating layer 24. The active layer 23 includes a source region 23-1 and a drain region 23-3 and further includes a channel region 23-2 therebetween.

The active layer 23 may include at least one of various materials. In one embodiment, for example, the active layer 23 may include an inorganic semiconductor material such as amorphous silicon or crystalline silicon. In an alternative embodiment, the active layer 23 may include an oxide semiconductor, for example. In another alternative embodiment, the active layer 23 may include an organic semiconductor material, for example. Hereinafter, for convenience of description, embodiments where the active layer 23 includes amorphous silicon will be mainly described in detail.

The active layer 23 may be formed by providing or forming an amorphous silicon film on the buffer layer 22, crystallizing the amorphous silicon film to form a polycrystalline silicon film, and patterning the polycrystalline silicon film. The source region 23-1 and the drain region 23-3 of the active layer 23 are doped with impurities according to the type of thin film transistor TFT such as a driving thin film transistor (not shown) and a switching thin film transistor (not shown).

A gate electrode 25 corresponding to the active layer 23 and an interlayer insulating layer 26 covering the gate electrode 25 are disposed or formed on the upper surface of the gate insulating layer 24.

In an embodiment, after a contact hole H1 is formed in the interlayer insulating layer 26 and the gate insulating layer 24, a source electrode 27-1 and a drain electrode 27-2 are disposed or formed on the interlayer insulating layer 26 to respectively contact the source region 23-1 and the drain region 23-2.

The passivation layer 27 is disposed or formed over the thin film transistor TFT, and a pixel electrode 28-1 of the organic light-emitting device 28 is disposed or formed on the passivation layer 27. The pixel electrode 28-1 contacts the drain electrode 27-2 of the thin film transistor TFT through a via hole H2 defined or formed in the passivation layer 27. The passivation layer 27 may include an inorganic material and/or an organic material to have a single or multi-layer structure, and may be a planarization layer having a flat upper surface regardless of a curvature of a lower layer or may be curved along the curvature of the lower layer. The passivation layer 27 may include a transparent insulating material to achieve a resonance effect.

In an embodiment, after the pixel electrode 28-1 is formed on the passivation layer 27, a pixel-defining layer 29 including or formed of an organic material and/or an inorganic material may be formed or provided to cover the pixel electrode 28-1 and the passivation layer 27 and to expose the pixel electrode 28-1.

The pixel electrode 28-1 may function as an anode electrode and an opposite electrode 28-3 may function as a cathode electrode, or polarities of the pixel electrode 28-1 and the opposite electrode 28-3 may be opposite to each other.

The pixel electrode 28-1 and the opposite electrode 28-3 may be insulated from each other by an intermediate layer 28-2 and may apply voltages of different polarities to the intermediate layer 28-2 so that an organic emission layer emits light.

The intermediate layer 28-2 may include the organic emission layer. In one embodiment, for example, the intermediate layer 28-2 may include the organic emission layer and may further include at least one of a hole injection layer ("HIL"), a hole transport layer ("HTL"), an electron transport layer ("ETL"), and an electron injection layer ("EIL"). However, embodiments of the disclosure are not limited thereto, and the intermediate layer 28-2 may include the organic emission layer and further include other various functional layers (not shown).

A plurality of intermediate layers 28-2 may be provided and may form the display area DA. In an embodiment, the plurality of intermediate layers 28-2 may form the display area DA having a shape other than a rectangle and a square. In such an embodiment, the plurality of intermediate layers 28-2 may be spaced apart from one another in the display area DA.

Each unit pixel may include a plurality of subpixels, and the plurality of subpixels may emit light of various colors. In one embodiment, for example, the plurality of subpixels may include subpixels that emit red light, green light, and blue light, or may include subpixels (not shown) that emit red light, green light, blue light, and white light.

The opposite electrode 28-3 is arranged on the intermediate layer 28-2. The opposite electrode 28-3 may be integrally formed as a single unitary unit to cover a plurality of pixels. The opposite electrode 28-3 may include a light-transmissive conductive layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof.

In an embodiment, although not shown in the drawings, a capping layer may be further arranged on the opposite electrode 28-3, the capping layer including LiF, an inorganic insulating material, or an organic insulating material. In such an embodiment, the capping layer may be arranged between the opposite electrode 28-3 and the thin film encapsulation layer E.

The thin film encapsulation layer E may be arranged on the opposite electrode 28-3. The thin film encapsulation layer E may include a plurality of inorganic layers, or may include an inorganic layer and an organic layer.

The organic layer of the thin film encapsulation layer E may include a polymer, for example, and may have a single or multi-layer structure including at least one selected from polyethylene terephthalate, polyimide, polycarbonate, epoxy, polyethylene, and polyacrylate. In an embodiment, the organic layer may include polyacrylate, or may include a polymerized monomer composition including a diacrylate-based monomer and a triacrylate-based monomer. The monomer composition may further include a monoacrylate-based monomer. Also, the monomer composition may further include any suitable photo-initiator such as trimethyl-benzoyl-diphenyl-phosphine oxide ("TPO"), but the disclosure is not limited thereto.

The inorganic layer of the thin film encapsulation layer E may include one or more inorganic insulating materials such as aluminum oxide, titanium oxide, tantalum oxide, hafnium oxide, zinc oxide, silicon oxide, silicon nitride, or silicon oxynitride, and may be formed by chemical vapor deposition ("CVD") or the like.

An uppermost layer of the thin film encapsulation layer E that is exposed to the outside may be an inorganic layer to prevent penetration of moisture into the organic light-emitting device 28.

In an embodiment, the thin film encapsulation layer E may include at least one sandwich structure in which at least one organic layer is between at least two inorganic layers. In an alternative embodiment, the thin film encapsulation layer E may include at least one sandwich structure in which at least one inorganic layer is between at least two organic layers. In another alternative embodiment, the thin film encapsulation layer E may include a sandwich structure in which at least one organic layer is between at least two inorganic layers and a sandwich structure in which at least one inorganic layer is between at least two organic layers.

In an embodiment, the thin film encapsulation layer E may include a first inorganic layer, a first organic layer, and a second inorganic layer that are sequentially stacked on the organic light-emitting device 28.

In an alternative embodiment, the thin film encapsulation layer E may include a first inorganic layer, a first organic layer, a second inorganic layer, a second organic layer, and a third inorganic layer that are sequentially stacked on the organic light-emitting device 28.

In another alternative embodiment, the thin film encapsulation layer E may include a first inorganic layer, a first organic layer, a second inorganic layer, a second organic layer, a third inorganic layer, a third organic layer, and a fourth inorganic layer that are sequentially stacked on the organic light-emitting device 28.

The first organic layer may have an area less than that of the second inorganic layer, and the second organic layer may have an area less than that of the third inorganic layer.

The input sensing member 30 may be arranged on the thin film encapsulation layer E. The input sensing member 30 may have a structure in which a first touch conductive layer 31, a first insulating layer 32, a second touch conductive layer 33, and a second insulating layer 34 are sequentially stacked on the thin film encapsulation layer E. In such an embodiment, the first touch conductive layer 31 and the second touch conductive layer 33 may collectively define a touch electrode.

In an embodiment, the second touch conductive layer 33 serves as a sensor portion for detecting a touch thereon, and the first touch conductive layer 31 may serve as a connection portion for connecting to the second touch conductive layer 33, which is patterned, in one direction.

In an alternative embodiment, both the first touch conductive layer 31 and the second touch conductive layer 33 may serve as sensor portions. In one embodiment, for example, a via hole for exposing the upper surface of the first touch conductive layer 31 is defined or formed through the first insulating layer 32, and the first touch conductive layer 31 and the second touch conductive layer 33 may be connected through the via hole. In an embodiment, where the first touch conductive layer 31 and the second touch conductive layer 33, which define the touch electrode, are used as described above, the resistance of the touch electrode may decrease and thus a response speed of the input sensing member 30 may be improved.

In an embodiment, the touch electrode may be in a mesh structure to allow light emitted from the organic light-emitting device 28 to pass therethrough. Accordingly, the first touch conductive layer 31 and the second touch conductive layer 33 of the touch electrode may be arranged not to overlap an emission area of the organic light-emitting device 28.

The first touch conductive layer 31 and the second touch conductive layer 33 may each have a single layer or multi-layer structure including a conductive material having high conductivity. In one embodiment, for example, each of the first touch conductive layer 31 and the second touch conductive layer 33 may include at least one of a transparent conductive layer and a single layer or multi-layer structure including a conductive material including Al, Cu, and/or Ti. The transparent conductive layer may include a transparent conductive oxide such as indium tin oxide ("ITO"), indium zinc oxide ("IZO"), zinc oxide (ZnO), or indium tin zinc oxide ("ITZO"). In such an embodiment, the transparent conductive layer may include a conductive polymer such as poly(3,4-ethylenedioxythiophene) ("PEDOT"), a metal nanowire, graphene, or the like. In an embodiment, the first touch conductive layer 31 and the second touch conductive layer 33 may each have a stacked structure of Ti/Al/Ti.

The first insulating layer 32 and the second insulating layer 34 may each include an inorganic material or an organic material. The inorganic material may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may include at least one of acrylic resin, methacrylic resin, polyisoprene, vinyl resin, epoxy resin, urethane resin, cellulose resin, and perylene resin.

In an embodiment, the input sensing member 30 is directly formed on the thin film encapsulation layer E by deposition and the like, such that a separate adhesive layer on the thin film encapsulation layer E may be omitted. Therefore, in such an embodiment, the thickness of the display panel 20-1 may be reduced.

The input sensing member 30 may further include a touch buffer layer (not shown) between the thin film encapsulation layer E and the first insulating layer 32. The touch buffer layer may effectively prevent damage to the thin film encapsulation layer E and may block a signal interference that may occur when the input sensing member 30 is driven. The touch buffer layer may include an inorganic material such as silicon oxide, silicon nitride, silicon oxynitride, aluminum oxide, aluminum nitride, titanium oxide or titanium nitride, or an organic material such as polyimide, polyester, or acryl, and may have a stacked structure including a plurality of materials of the materials mentioned above.

The input sensing member 30 may be arranged at variously modified positions in variously modified forms other than those described above. In one embodiment, for example, the input sensing member 30 may be provided or formed in a form of a touch panel and attached to the cover member 10.

In an embodiment, the panel member 20 may further include an optical functional member 20-2 in addition to the display panel 20-1.

The optical functional member 20-2 may include a phase retarder and a polarizer. The phase retarder may be of a film type or a liquid crystal coating type, and may include a λ/2 phase retarder and/or a λ/4 phase retarder. The polarizer may also be of a film type or a liquid crystal coating type. The film type may include an elongated synthetic resin film, and the liquid crystal coating type may include liquid crystals arranged in a predetermined arrangement.

In an alternative embodiment, the optical functional member 20-2 may include a black matrix and color filters. The color filters may be arranged to correspond to the color of light to be emitted from each of the pixels of the display panel 20-1. Each of the color filters may include a red, green, or blue pigment or dye. Alternatively, each of the color filters may further include quantum dots in addition to the aforementioned pigment or dye. Alternatively, some of the color filters may not include the aforementioned pigment or dye and may include scattering particles such as titanium oxide.

In another alternative embodiment, the optical functional member 20-2 may include an offset interference structure. The offset interference structure may include a first reflective layer and a second reflective layer that are arranged in different layers from each other. First reflected light and second reflected light reflected from the first reflective layer and the second reflective layer, respectively, may destructively interfere with each other, and thus, external light reflectance may be reduced.

An adhesive layer 40 may be arranged between the display panel 20-1 and the optical functional member 20-2. The adhesive layer 40 may include a light transmissive material, and the input sensing member 30 may be located in the adhesive layer 40 or the adhesive layer 40 may be located on the input sensing member 30.

In an embodiment, the support member 50 may be coupled to the panel member 20. In such an embodiment, the support member 50 may be arranged on a surface of the panel member 20, which is different from another surface of the panel member 20 on which the cover member 10 is disposed. In such an embodiment, the panel member 20 may be disposed between the cover member 10 and the support member 50.

The support member 50 may include various members or layers. In one embodiment, for example, the support member 50 may include at least one of a cushion member 51, a heat dissipation member 52, and a shielding member 53. The cushion member 51 may include a first cushion member 51-1 attached to the panel member 20, and a second cushion member 51-2 connected to and arranged on a surface of the first cushion member 51-1 which is opposite to a surface of the first cushion member 51-1 attached to the panel member 20. The first cushion member 51-1 and the second cushion member 51-2 may each include an elastic material such as rubber, silicon, or urethane. In an embodiment, the first cushion member 51-1 may include a plurality of protrusions arranged or defined on the surface thereof to be spaced apart from one another. The plurality of protrusions may protrude toward the panel member 20 to at least partially absorb a force applied thereto via the panel member 20 when a force is applied to the panel member 20. A separate adhesive layer may be arranged between the first cushion member 51-1 and the panel member 20 to adhere the first cushion member 51-1 to the panel member 20. In an embodiment, the adhesive layer may be arranged between the substrate 21 and the first cushion member 51-1. The second cushion member 51-2 may be in a plate shape to support the panel member 20 and the first cushion member 51-1.

The heat dissipation member 52 may be arranged on the cushion member 51 to dissipate heat to the outside. In an embodiment, the heat dissipation member 52 may have a single layer structure including polyimide or may have a multilayer structure with a plurality of layers including a layer including polyimide and another layer including graphite. In an embodiment, where the heat dissipation member 52 includes a plurality of layers, each including polyimide, may be arranged to be closer to the second cushion member 51-2 than the other layers among the plurality of layers. Materials of the heat dissipation member 52 are not limited to those described above and may include any material capable of dissipating heat to the outside.

The shielding member 53 may be arranged on the heat dissipation member 52 to shield external electric signals or electronic signals. The shielding member 53 may include a metal material. In one embodiment, for example, the shielding member 53 may include copper. The shielding member 53 may be in a plate shape.

The support member 50 may further include a thermal reaction tape (not shown).

In an embodiment, the size of the support member 50 may be less than the size of the cover member 10. In such an embodiment, the size of the support member 50 may be equal to or less than the size of the panel member 20. In one embodiment, for example, the width of the support member 50 (e.g., in the Y direction of FIG. 1A) may be equal to or less than the width of the panel member 20. In addition, the length of the support member 50 (e.g., in the X direction of FIG. 1A) may be equal to or less than the length of the panel member 20. The widths and lengths of the support member 50 and the panel member 20 may be measured when the support member 50 and the panel member 20 are laid out on a flat plane without curvature.

In such an embodiment, the panel member 20 and the support member 50 may provide a space in which the cover member 10 and another device are capable of being coupled to each other when the cover member 10 and the other device are coupled to each other, and may also prevent a force from being applied by the cover member 10 and the other device, and thus, breakage or damage of the panel member 20 and the support member 50 may be effectively prevented. In such an embodiment, the panel member 20 and the support member 50 may be arranged on a portion of the second region 10-2 and a portion of the third region 10-3 to reinforce the strength of a curved portion of the cover member 10.

Figure 4:
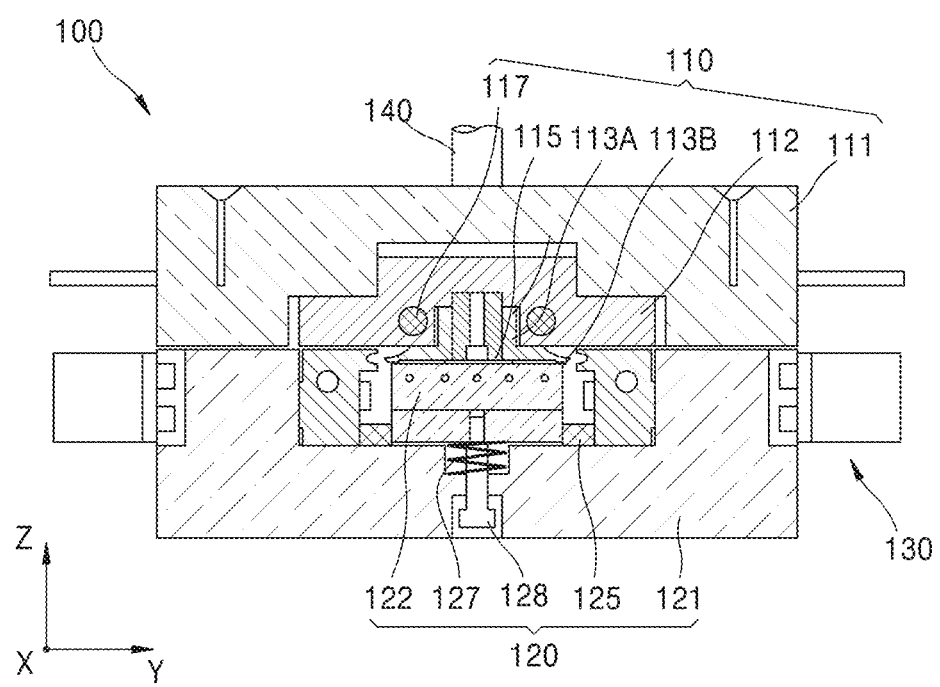
FIG. 4 is a cross-sectional view of an apparatus for manufacturing a display device according to an embodiment.

FIG. 4 is a cross-sectional view of an apparatus 100 for manufacturing a display device, according to an embodiment.

Referring to FIG. 4, an embodiment of the apparatus 100 for manufacturing a display device may include a first jig portion 110, a second jig portion 120, and a third jig portion 130. The first jig portion 110 may linearly move, and when the support member 50 is seated, the second jig portion 120 may primarily mold the support member 50 based on the linear movement of the first jig portion 110. In such an embodiment, the third jig portion 130 may secondarily mold the support member 50 that is primarily molded.

Hereinafter, each jig portion will be described in detail.

Figure 5:
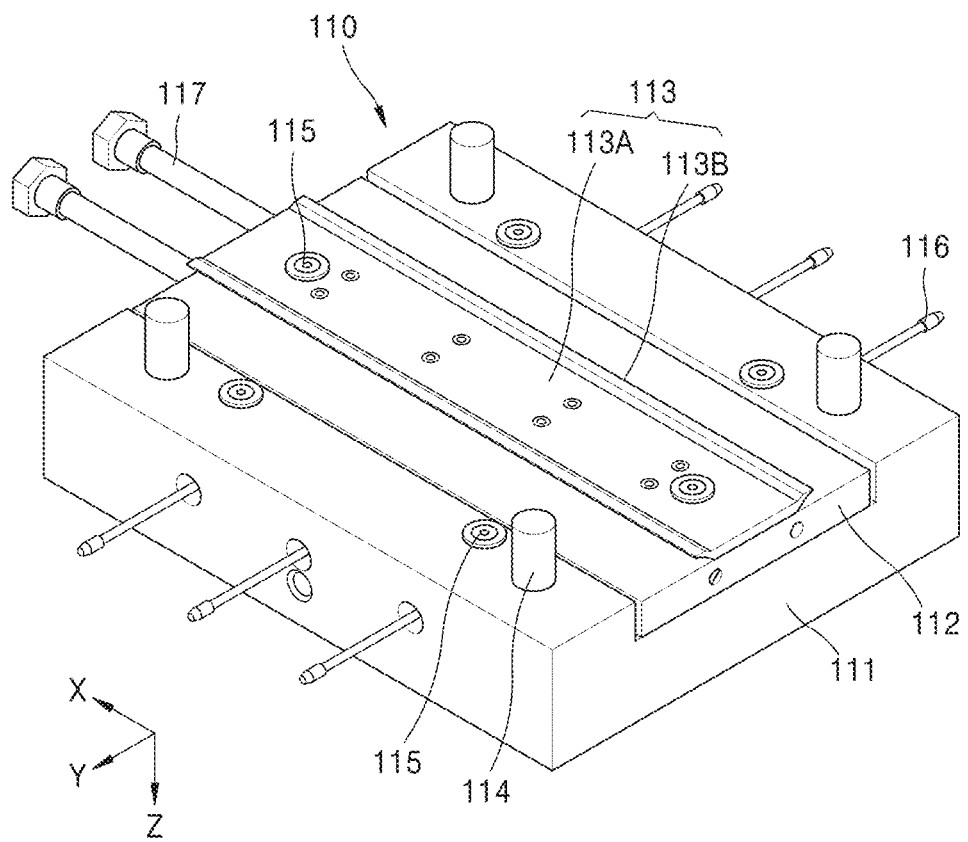
FIG. 5 is a perspective view of a first jig portion shown in FIG. 4.
Figure 6:
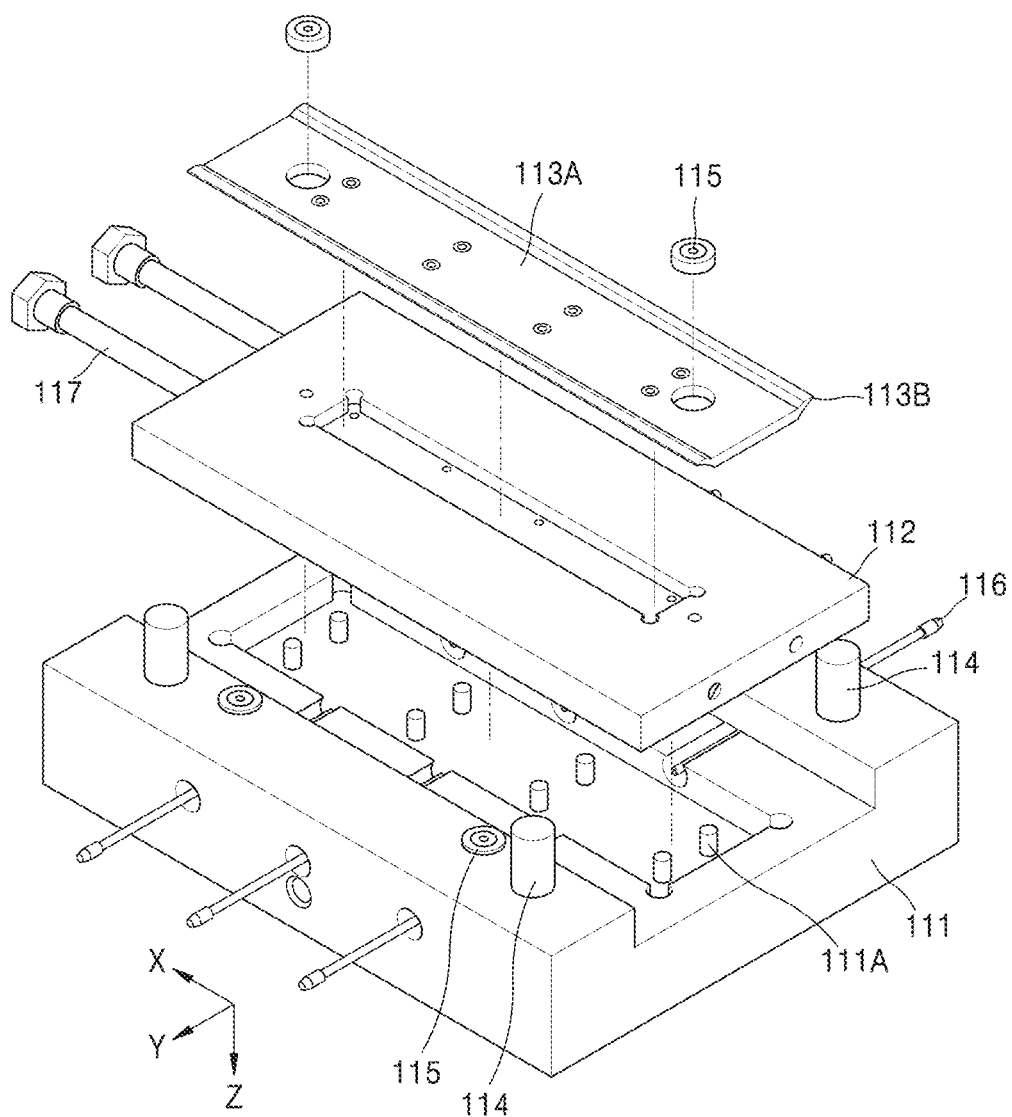
FIG. 6 is an exploded perspective view of the first jig portion shown in FIG. 5.

FIG. 5 is a perspective view of the first jig portion 110 shown in FIG. 4. FIG. 6 is an exploded perspective view of the first jig portion 110 shown in FIG. 5.

Referring to FIGS. 5 and 6, the first jig portion 110 may be arranged to be spaced apart from one surface of the support member 50 and may linearly move. The first jig portion 110 may be connected to a jig driver 140. The jig driver 140 may be in one of various forms. In one embodiment, for example, the jig driver 140 may include a cylinder. In an alternative embodiment, the jig driver 140 may include a nut connected to the first jig portion 110, a screw in which the nut linearly moves, and a motor connected to the screw. In another alternative embodiment, the jig driver 140 may include a linear motor connected to the first jig portion 110. In such embodiments, the jig driver 140 is not limited to those described above and may include any device or structure that allows the first jig portion 110 to linearly move. In another alternative embodiment, the jig driver 140 may not be connected to the first jig portion 110 but may be connected to the second jig portion 120 to linearly move the second jig portion 120. In such an embodiment, the first jig portion 110 may be fixed. However, hereinafter, for convenience of description, embodiments where the jig driver 140 is connected to the first jig portion 110 will be mainly described in detail.

The first jig portion 110 may include first support portions 111 and 112, a first pressing portion 113, a first guide portion 114, a first protrusion portion 115, a first temperature measuring portion 116, and a first heating portion 117.

The first support portions 111 and 112 may include a first coupling support portion 111 connected to the jig driver 140 and a second coupling support portion 112 connected to the first coupling support portion 111. The first coupling support portion 111 may have a groove defined or formed therein, and the second coupling support portion 112 may be accommodated in the groove. In such an embodiment, as shown in FIG. 6, a coupling protrusion 111A for coupling with the second coupling support portion 112 may be arranged in the groove to protrude toward the first pressing portion 113. In such an embodiment, portions of the first guide portion 114 and the first protrusion portion 115 may be arranged in the first coupling support portion 111.

The first pressing portion 113 may include a pressing body portion 113A and a protrusion portion 113B. A portion of the pressing body portion 113A may protrude toward the second coupling support portion 112, and the portion of the pressing body portion 113A, which protrudes from the pressing body portion 113A, may be inserted into and coupled to a groove formed in the second coupling support portion 112. One surface of the pressing body portion 113A may be flat. The protrusion portion 1136 may be arranged on a side surface of the pressing body portion 113A. The end of the protrusion portion 113B may have a curved surface (see FIG. 4). In an embodiment, the end of the protrusion portion 113B may guide a bending path of a portion of the support member 50 when a portion of the support member 50 is bent during the molding of the support member 50.

The first guide portion 114 may be arranged on the first support portions 111 and 112 to protrude from the first support portions 111 and 112 toward the second jig portion (not shown). The first guide portion 114 may have a cylindrical or polygonal shape.

The first protrusion portion 115 may be arranged on the first jig portion 110 to maintain a gap between the outer surface of the first jig portion 110 and an outer surface of the second jig portion 120. A plurality of first protrusion portions 115 may be provided and may be arranged at various positions. In one embodiment, for example, some of the plurality of first protrusion portions 115 may be arranged on the outer surface of the first pressing portion 113, and some other of the plurality of first protrusion portions 115 may be arranged on the outer surfaces of the first support portions 111 and 112. In each of the first protrusion portions 115, the height of a portion protruding from the outer surface of the first jig portion 110 may be adjusted. In one embodiment, for example, screws, bolts, etc. for height adjustment may be arranged in each of the first protrusion portions 115 to adjust the extent to which each of the first protrusion portions 115 protrudes from the outer surface of the first jig portion 110 according to rotation. When the first jig portion 110 approaches the second jig portion 120 during the linear movement of the first jig portion 110, the first protrusion portion 115 may prevent the outer surface of the first jig portion 110 and the outer surface of the second jig portion 120 from directly contacting each other and may also prevent an excessive force from being applied to the support member 50. The first protrusion portion 115 may include an elastic material such as rubber, silicon, and/or urethane and thus may prevent an impact on the outer surface of the second jig portion 120 or cracks in the outer surface of the second jig portion 120 when the first protrusion portion 115 contacts the outer surface of the second jig portion 120.

The first temperature measuring portion 116 may be arranged inside the first support portions 111 and 112. In an embodiment, the first temperature measuring portion 116 may be arranged in the second coupling support portion 112 (e.g., the first coupling support portion 111) to measure the internal temperature of the first support portions 111 and 112 (e.g., the first coupling support portion 111). In such an embodiment, the first temperature measuring portion 116 may include a sensor. The first temperature measuring portions 116 may be provided in plural to be arranged to be spaced apart from one another. The plurality of first temperature measuring portions 116 may be spaced apart from one another in a lengthwise direction (e.g., in the X-axis direction of FIG. 5) of the first support portions 111 and 112.

The first heating portion 117 may be arranged inside the first support portions 111 and 112 to adjust the temperatures of the first support portions 111 and 112. In an embodiment, the first heating portion 117 may operate based on the temperatures of the first support portions 111 and 112 measured by the first temperature measuring portion 116. In such an embodiment, the first heating portion 117 may be arranged inside the second coupling support portion 112. In such an embodiment, the first heating portion 117 may be arranged on the side of the second coupling support portion 112. In one embodiment, for example, the first heating portion 117 may be spaced apart from an imaginary straight line to the side of the second coupling support portion 112. Here, the imaginary straight line is a line parallel to a lengthwise direction of the second coupling support portion 112 and passing through the center of the second coupling support portion 112. In such an embodiment, the first heating portion 117 may apply heat to a side portion of the support member 50 when the support member 50 is molded. In such an embodiment, the first heating portion 117 may help the deformation of the support member 50 by applying heat to a portion of the support member 50 where deformation occurs. The first heating portion 117 may be provided in plural, and the plurality of first heating portions 117 may correspond to a portion of the support member 50 to be deformed.

Figure 7:
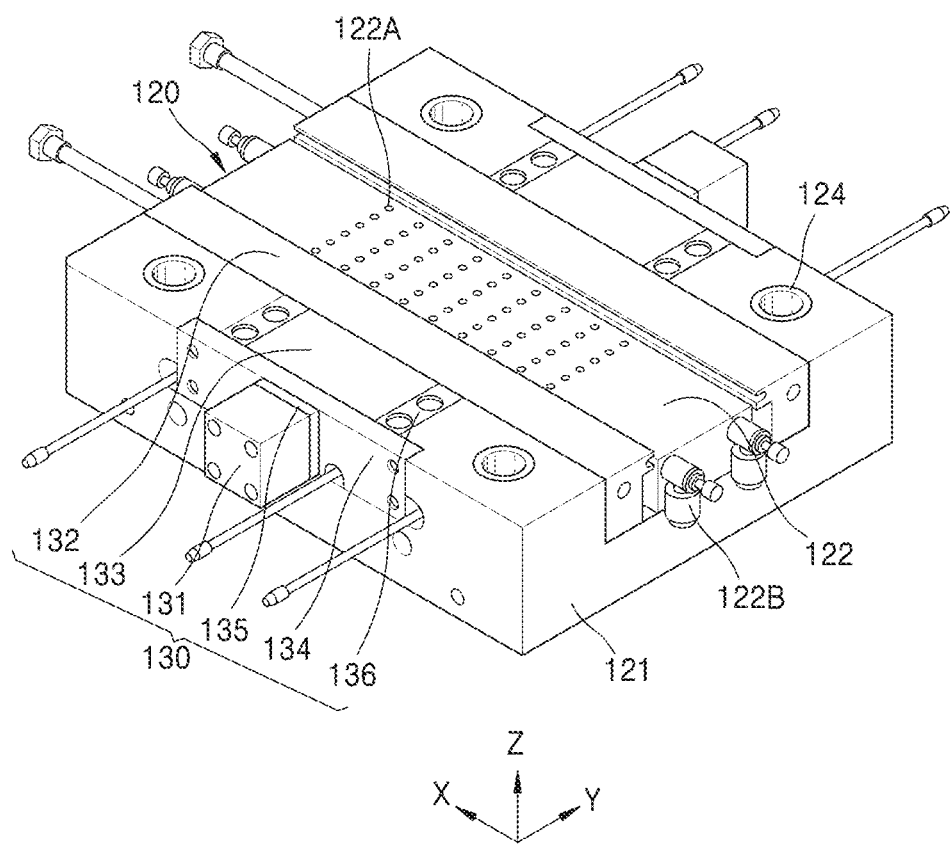
FIG. 7 is a perspective view illustrating a second jig portion and a third jig portion shown in FIG. 4.
Figure 8:
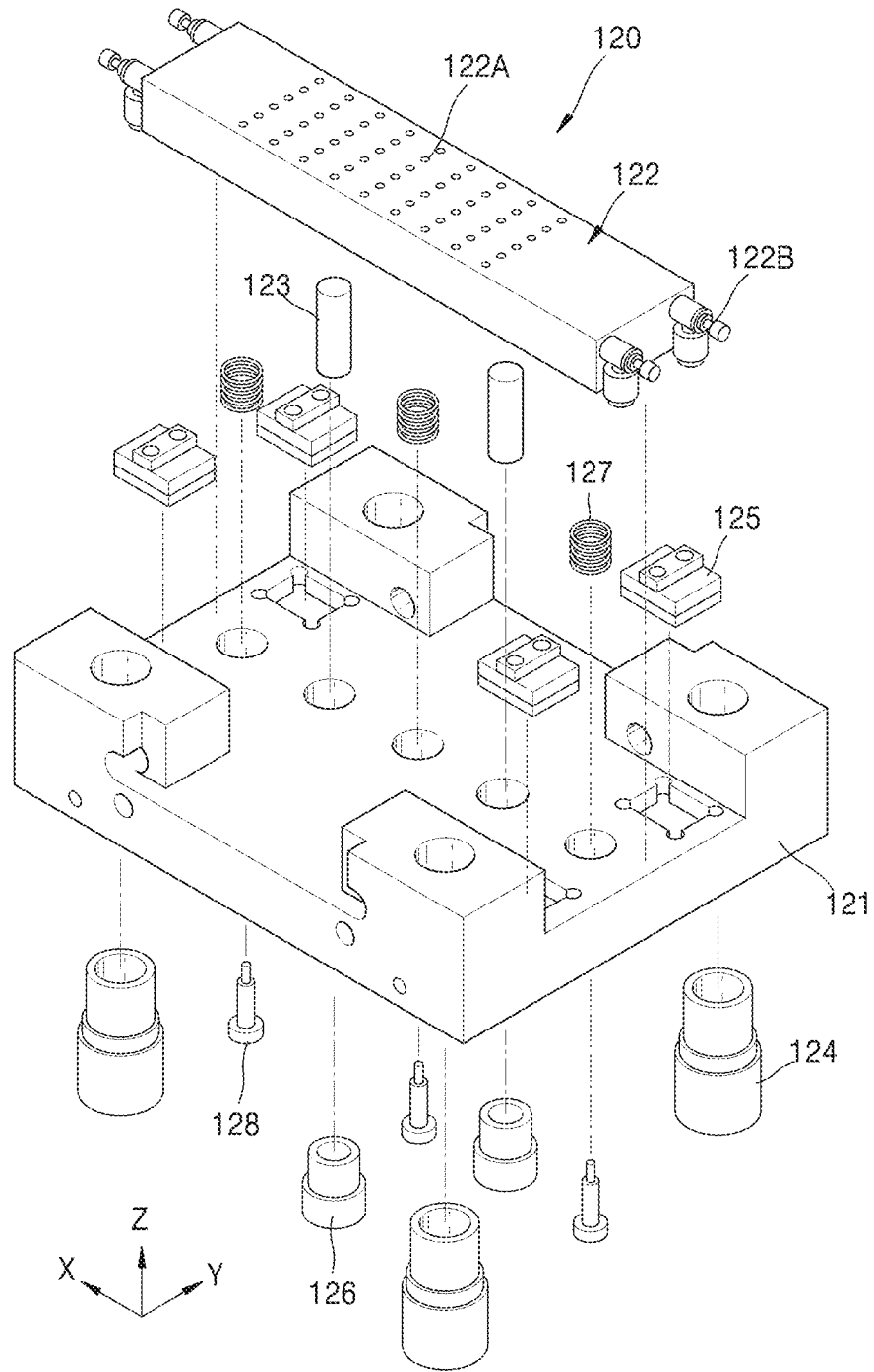
FIG. 8 is an exploded perspective view of the second jig portion shown in FIG. 7.
Figure 9:
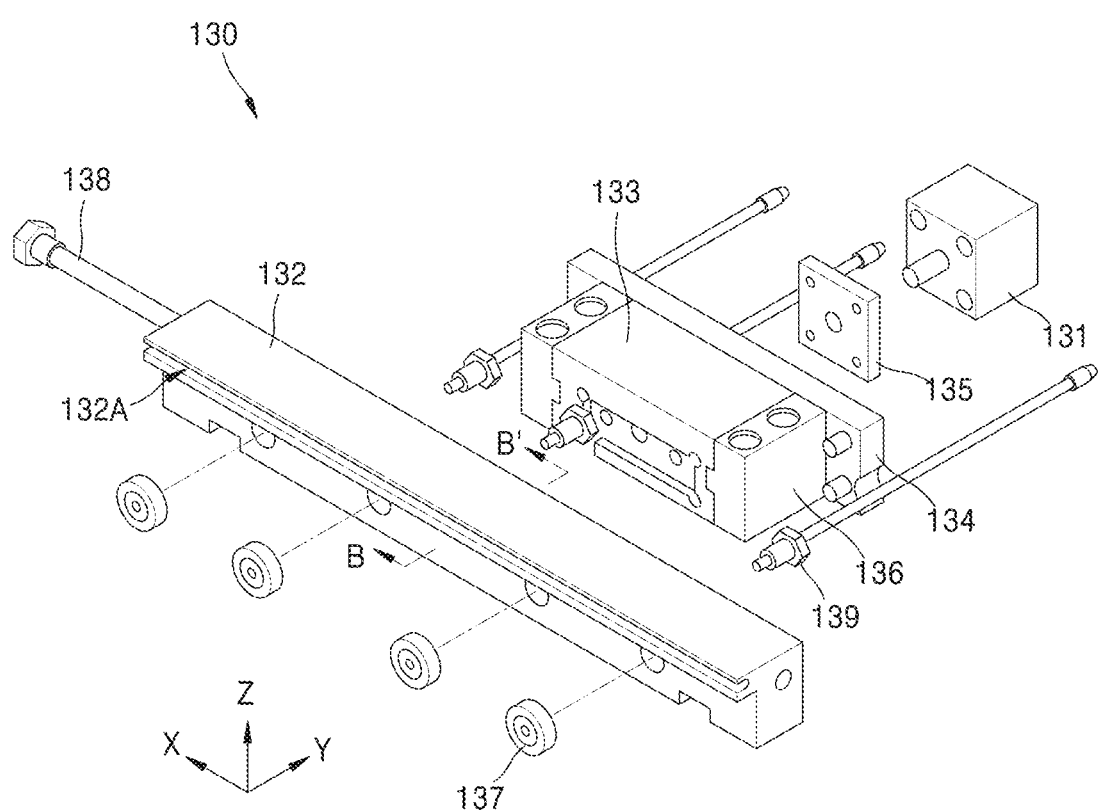
FIG. 9 is an exploded perspective view of the third jig portion shown in FIG. 7.
Figure 10:
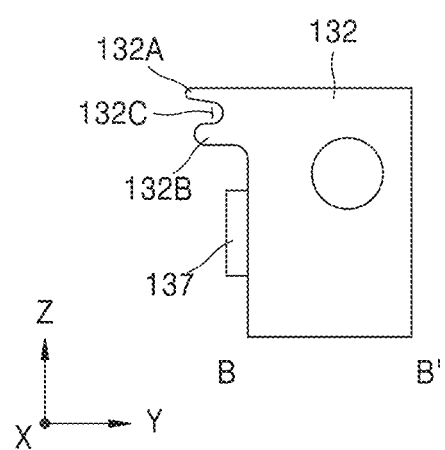
FIG. 10 is a cross-sectional view taken along line B-B' of FIG. 9.
Figure 11:
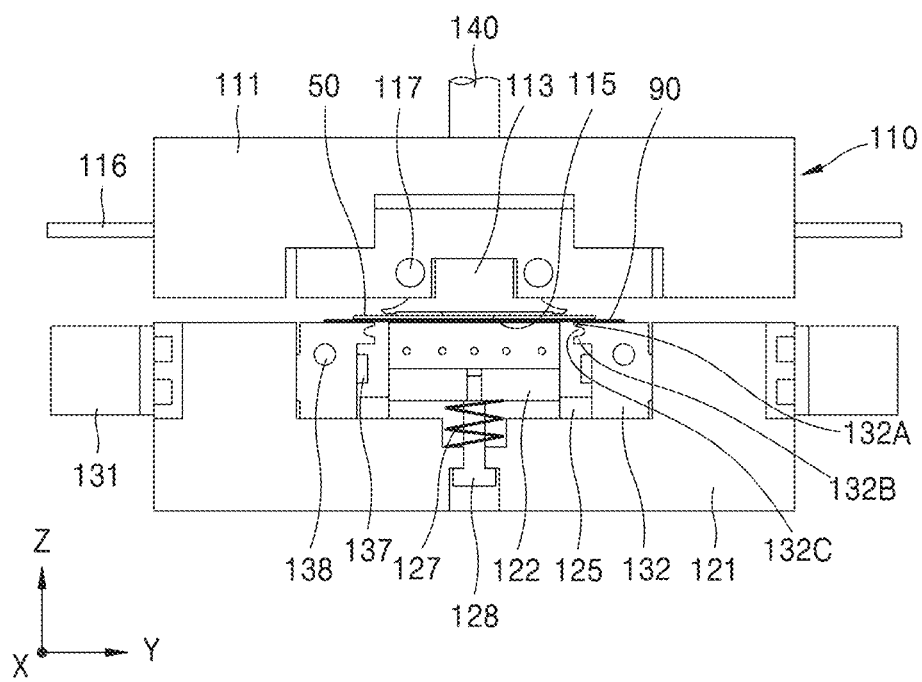
FIGS. 11 to 15 are cross-sectional views illustrating a method of manufacturing a support member of a display device according to embodiments.
Figure 12:
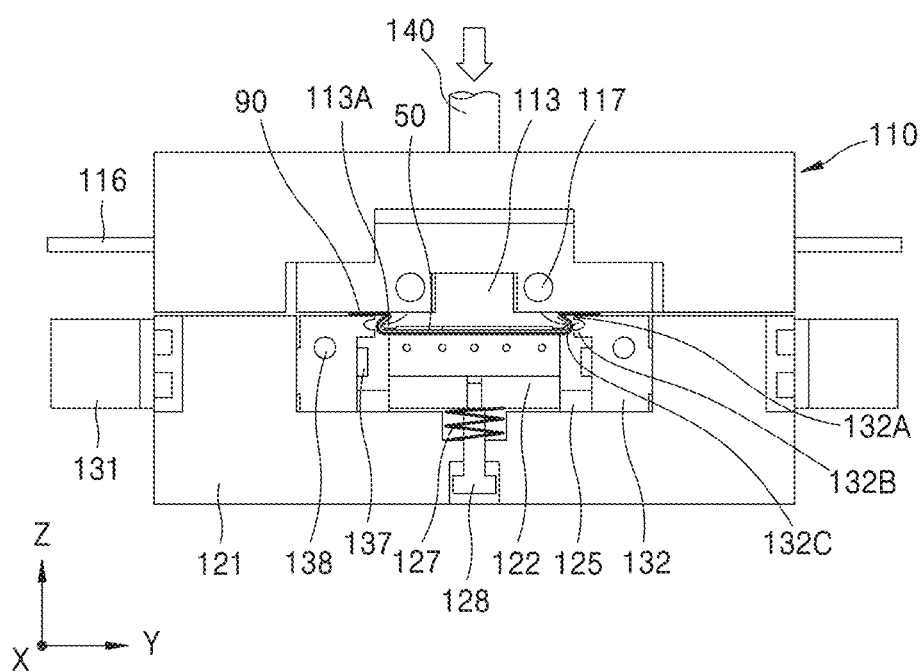

FIG. 7 is a perspective view illustrating the second jig portion 120 and the third jig portion 130 shown in FIG. 4. FIG. 8 is an exploded perspective view of the second jig portion 120 shown in FIG. 7. FIG. 9 is an exploded perspective view of the third jig portion 130 shown in FIG. 7. FIG. 10 is a cross-sectional view taken along line B-B' of FIG. 9.

Referring to FIGS. 7 to 10, an embodiment of the second jig portion 120 may be arranged to face a first jig portion (not shown) so that the support member 50 may be seated. The third jig portion 130 may be arranged on a side surface of the second jig portion 120.

The second jig portion 120 may include a second support portion 121, a linear movement portion 122, a first linear guide portion 123, a second guide portion 124, a third guide portion 125, a second linear guide portion 126, an elastic portion 127, and a gap adjusting portion 128.

The second support portion 121 may face the first support portions 111 and 112. The second support portion 121 may be fixed to a separate device or a building. The linear movement portion 122 may be accommodated in the second support portion 121, and a groove may be defined or formed in the second support portion 121 to provide a space in which the linear movement portion 122 linearly moves. The groove may provide a space so that the third jig portion 130 is seated therein and a portion of the third jig portion 130 linearly moves.

The linear movement portion 122 may be accommodated in the second support portion 121 and linearly move during the linear movement of the first support portions 111 and 112. The linear movement portion 122 may be long in a lengthwise direction of the support member 50. The linear movement portion 122 may have a suction hole 122A formed in a surface thereof to absorb the support member 50. In an embodiment, the linear movement portion 122 may be connected to the support member 50 and may include a connection passage 122B that communicates with (or is connected to) the suction hole 122A and provides a movement path of gas inside the suction hole 122A. The connection passage 122B may be connected to an external pump or the like to suck gas inside the suction hole 122A.

The first linear guide portion 123 may be connected to the linear movement portion 122. The first linear guide portion 123 may be in a pillar shape to protrude toward the second support portion 121.

The second guide portion 124 may be inserted into the first guide portion 114 and may guide the movement of the first guide portion 114. The shape of the second guide portion 124 may be variously modified based on the shape of the first guide portion 114. In one embodiment, for example, one of the first guide portion 114 and the second guide portion 124 may be formed in a pillar shape as described above, and the other of the first guide portion 114 and the second guide portion 124 may be in a guide bush shape. Shapes of the first guide portion 114 and the second guide portion 124 are not limited to those described above and may have any shape or structure capable of guiding the movement of one of the first support portion 111 or 112 and the second support portion 121 when the first support portion 111 or 112 and the second support portion 121 move relative to each other.

The third guide portion 125 may guide the movement of the second pressing portion 132 to be described below. The third guide portion 125 may be partially inserted into the second support portion 121 and be fixed. The third guide portion 125 may include a linear motion guide.

The second linear guide portion 126 may correspond to the first linear guide portion 123 to guide the movement of the linear movement portion 122. One of the first linear guide portion 123 and the second linear guide portion 126 may be in a pillar shape, and the other of the first linear guide portion 123 and the second linear guide portion 126 may be in a guide bush shape. Hereinafter, for convenience of description, embodiments where the first linear guide portion 123 is a pillar-shaped member as described above and the second linear guide portion 126 is in a guide bush shape will be mainly described in detail.

A portion of the elastic portion 127 may be inserted into the second support portion 121, and the other portion of the elastic portion 127 may protrude from the outer surface of the second support portion 121. The elastic portion 127 may contact the linear movement portion 122 and be compressed according to the movement of the linear movement portion 122, and may provide a restoring force to the linear movement portion 122. The elastic portion 127 may be provided in plural. The plurality of elastic portions 127 may be spaced apart from each other in a lengthwise direction of the linear movement portion 122. The elastic portion 127 may be in the form of a bar including an elastic material such as silicon or rubber. In an alternative embodiment, the elastic portion 127 may include a coil spring. Hereinafter, for convenience of description, embodiments where the elastic portion 127 includes a coil spring will be mainly described in detail.

The gap adjusting portion 128 may be connected to the linear movement portion 122 through the second support portion 121. The gap adjusting portion 128 may be inserted into the elastic portion 127. In an embodiment, the gap adjusting portion 128 may be fixed to the linear movement portion 122 and may move together with the linear movement portion 122. In an embodiment, a screw may be disposed or formed in a portion of the gap adjusting portion 128 coupled to the linear movement portion 122, thereby adjusting the extent to which the gap adjusting portion 128 is inserted into the linear movement portion 122. In such an embodiment, the gap adjusting portion 128 may adjust a gap between the outer surface of the linear movement portion 122 and the outer surface of the second support portion 121 as well as the length of the elastic portion 127.

The third jig portion 130 may include a driver 131, a second pressing portion 132, a moving block 133, a fixing bracket 134, a heat insulating member 135, a fourth guide portion 136, a second protrusion portion 137, a second heating portion 138, and a second temperature measuring portion 139.

The driver 131 may linearly move the second pressing portion 132 and the moving block 133. The driver 131 may have one of various forms. In one embodiment, for example, the driver 131 may include a pneumatic cylinder. In an alternative embodiment, the driver 131 may include a linear motor. In another alternative embodiment, the driver 131 may include a ball screw and a motor. Hereinafter, for convenience of description, embodiments where the driver 131 includes a pneumatic cylinder will be mainly described in detail.

One surface of the second pressing portion 132 may be flat. In one embodiment, for example, one surface of the second pressing portion 132, which faces the first support portion (not shown), may be flat.

The second pressing portion 132 may include curved portions 132A, 132B, and 132C. The curved portions 132A, 132B, and 132C may have an insertion groove 132C defined or formed therein. The cross-section of the insertion groove 132C may be formed in a curved shape. In an embodiment, the insertion groove 132C may be formed to correspond to the outer surface shape of the protrusion portion 113B.

A first protrusion 132A and a second protrusion 132B may be disposed or formed around the insertion groove 132C. The first protrusion 132A and the second protrusion 132B may be spaced apart from each other, and the insertion groove 132C may be arranged between the first protrusion 132A and the second protrusion 132B. The first protrusion 132A may protrude further toward the linear movement portion 122 than the second protrusion 132B. The end of the first protrusion 132A and the end of the second protrusion 132B may be curved. In such an embodiment, the end of the first protrusion 132A and the end of the second protrusion 132B may be formed to have a curvature.

The moving block 133 may connect the driver 131 to the second pressing portion 132. The moving block 133 may linearly move the second pressing portion 132 by linearly moving based on the operation of the driver 131.

The fixing bracket 134 may be fixed to the second support portion 121. The fixing bracket 134 may be in a plate shape and may support the driver 131.

The heat insulating member 135 may be arranged between the fixing bracket 134 and the driver 131. The heat insulating member 135 may be in a plate shape and may prevent heat from being transferred to the driver 131 through the fixing bracket 134.

The fourth guide portion 136 may be arranged between the second support portion 121 and the moving block 133 to guide the linear movement of the moving block 133. The fourth guide portion 136 may be fixed to the second support portion 121 or fixed to the fixing bracket 134. The fourth guide portion 136 may include a linear motion guide.

The second protrusion portion 137 may be arranged on one surface of the second pressing portion 132. The second protrusion portion 137 may adjust a gap between the side surface of the second pressing portion 132 and the side surface of the linear movement portion 122. In one embodiment, for example, the second protrusion portion 137 may be fixed to the second pressing portion 132 by bolts or screws, and the extent to which the second pressing portion 132 protrudes from the outer surface of the second pressing portion 132 may vary by adjusting the bolts or screws. The second protrusion portion 137 may include substantially a same elastic material as that of the first protrusion portion 115.

The second heating portion 138 may be inserted into the second pressing portion 132. The second heating portion 138 may include a heater and may be in a bar shape to be long in a lengthwise direction (e.g., the X-axis direction of FIG. 9) of the second pressing portion 132. The second heating portion 138 may at least partially overlap the protrusion portion 113B. In an embodiment, the second heating portion 138 may apply heat to a deformed portion of the support member 50.

The second temperature measuring portion 139 may be arranged in the second pressing portion 132 to measure the temperature inside the second pressing portion 132. The second temperature measuring portion 139 may include a sensor. In an embodiment, the second temperature measuring portion 139 may be provided in plural, and the plurality of second temperature measuring portions 139 may be arranged to be spaced apart from each other in a lengthwise direction of the second pressing portion 132.

Hereinafter, an embodiment of a method of molding the support member 50 will be described in detail.

FIGS. 11 to 15 are cross-sectional views illustrating a method of manufacturing a support member 50 of a display device according to embodiments.

Referring to FIGS. 11 to 15, the support member 50 may be in a state in which a film member 90 is attached thereto. In one embodiment, for example, the film member 90 may be attached to a cushion member (not shown) of the support member 50.

The film member 90, to which the support member 50 is attached, may be arranged on a second jig portion 120. One surface of a linear movement portion 122 may be arranged on a same plane as one surface of a second support portion 121, and thus, the film member 90 may be seated on the one surface of the second support portion 121 and the one surface of the linear movement portion 122. In such an embodiment, the linear movement portion 122 may fix the position of the support member 50 by adsorbing the film member 90 through a suction hole 122A (See FIG. 11).

When the support member 50 is seated on the second jig portion 120 as described above, a jig driver 140 may operate to linearly move a first jig portion 110. When the first jig portion 110 linearly moves, a first pressing portion 113 may press the support member 50. The first pressing portion 113 may press the linear movement portion 122 by pressing the support member 50, and the linear movement portion 122 may linearly move together with the first pressing portion 113.

In such an embodiment, a first protrusion portion 115 arranged in the first pressing portion 113 may contact the linear movement portion 122, and after the first protrusion portion 115 contacts the linear movement portion 122, the first protrusion portion 115 arranged in first support portions 111 and 112 may contact a second support portion 121.

In such an embodiment, an elastic portion 127 may be compressed according to the movement of the linear movement portion 122, and a gap adjusting portion 128 may linearly move together with the linear movement portion 122. In such an embodiment, a first guide portion 114 may be inserted into a second guide portion 124 and linearly move, according to the movement of the first jig portion 110, and a first linear guide portion 123 may be inserted into a second linear guide portion 126 and linearly move.

In such an embodiment, a first heating portion 117 may operate to increase the temperature of the first jig portion 110. The first heating portion 117 may operate before the first jig portion 110 linearly moves. In an alternative embodiment, the first heating portion 117 may operate while the first jig portion 110 linearly moves. A first temperature measuring portion 116 may measure the temperature of the first jig portion 110, and the operation of the first heating portion 117 may be adjusted based on a comparison of the temperature of the first jig portion 110 measured by the first temperature measuring portion 116 with a preset temperature. In one embodiment, for example, when the temperature of the first jig portion 110 measured by the first temperature measuring portion 116 is less than or equal to the preset temperature, the first heating portion 117 may be operated. In such an embodiment, when the temperature of the first jig portion 110 measured by the first temperature measuring portion 116 exceeds the preset temperature, the operation of the first heating portion 117 may be stopped.

When the first jig portion 110 linearly moves as described above, an end portion of the support member 50 may be bent by the first pressing portion 113 and a second pressing portion 132. In an embodiment, when the first pressing portion 113 presses a center portion of the support member 50 while linearly moving, the end of the support member 50 may be caught by a protrusion portion 113B of the second pressing portion 132 and thus rotate toward the first jig portion 110. Then, the end portion of the support member 50 may rotate about the protrusion portion 1136 according to the movement of the first pressing portion 113. In such an embodiment, the end portion of the support member 50 may be primarily bent. In one embodiment, for example, the end of the support member 50 may have a first angle at a portion where bending starts from a flat portion. In such an embodiment, a bent portion of the support member 50 may form to have a curved surface (or curve) having a first radius of curvature (see FIGS. 1 and 12).

When the above process is completed, the second pressing portion 132 may linearly move in a state, in which the first pressing portion 113 presses the linear movement portion 122, to secondarily press an end portion of the support member 50 which is primarily deformed. The second pressing portion 132 may linearly move along a third guide portion 125, and the moving block 133 may linearly move along a fourth guide portion 136.

In this case, a driver 131 may operate to linearly move the moving block 133 and the second pressing portion 132. The protrusion portion 113B and curved portions 132A, 132B, and 132C may press a deformed end portion of the support member 50 to secondarily mold the support member. In such an embodiment, the deformed end portion of the support member 50 may be accommodated in an insertion groove 132C and may press the support member 50 together with the protrusion portion 1136.

In an embodiment, the end portion of the support member 50 may be bent more than in the primary molding. In one embodiment, for example, the end portion of the support member 50 may form a curved surface (or curve) having a second radius of curvature. The second radius of curvature may be less than the first radius of curvature. In such an embodiment, the angle formed by a portion of the support member 50, in which bending is started at the boundary of a portion where the support member 50 is bent in a flat portion of the support member 50, and the flat portion of the support member 50 may be greater than the angle described with reference to FIG. 12. In such an embodiment, the end of the support member 50 may be arranged to face the other surface of the support member 50 which is different from one surface of the support member 50 seated on the linear movement portion 122.

During the process described above, the second heating portion 138 may adjust the temperature of the second pressing portion 132 to facilitate the deformation of the support member 50. In an embodiment, the second temperature measuring portion 139 may measure the temperature of the second pressing portion 132. The second heating portion 138 may be adjusted based on the temperature measured by the second temperature measuring portion 139. In such an embodiment, since the control method of the second heating portion 138 is similar to the control method of the first heating portion 117, any repetitive detailed description thereof will be omitted.

When the support member 50 is bent as described above, a film member 90 may also be bent together with the support member 50. In such an embodiment, a portion of the film member 90 (e.g., opposing ends of the film member 90) may be seated on the second support portion 121 to support the support member 50 (see FIG. 13).

Figure 13:
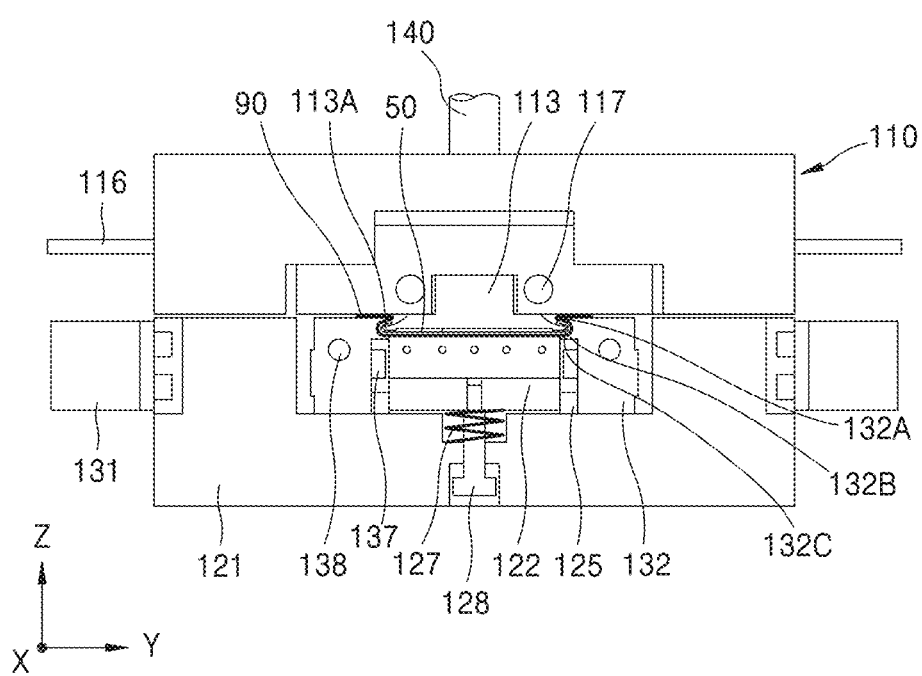
Figure 14:
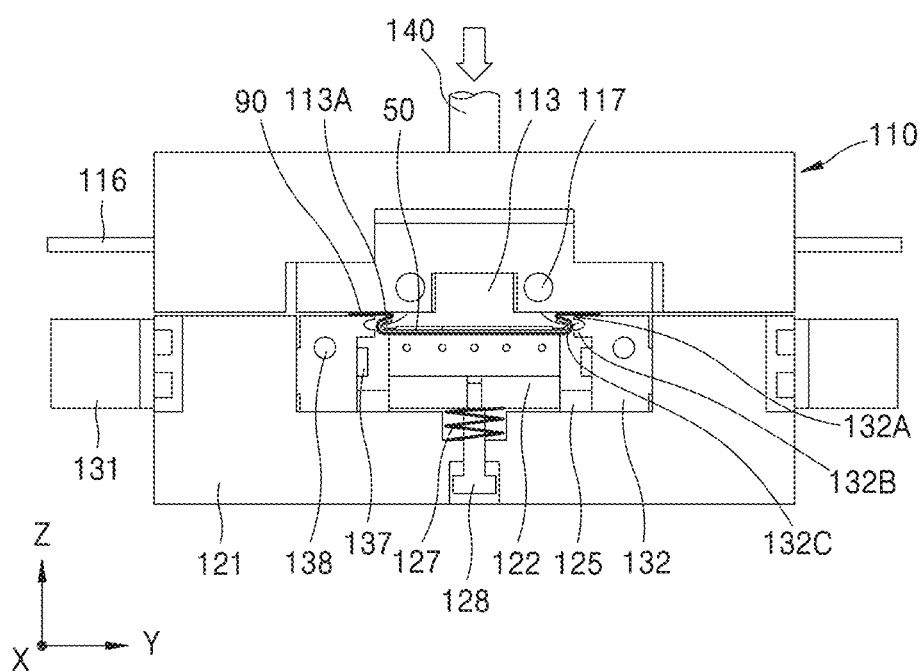
Figure 15:
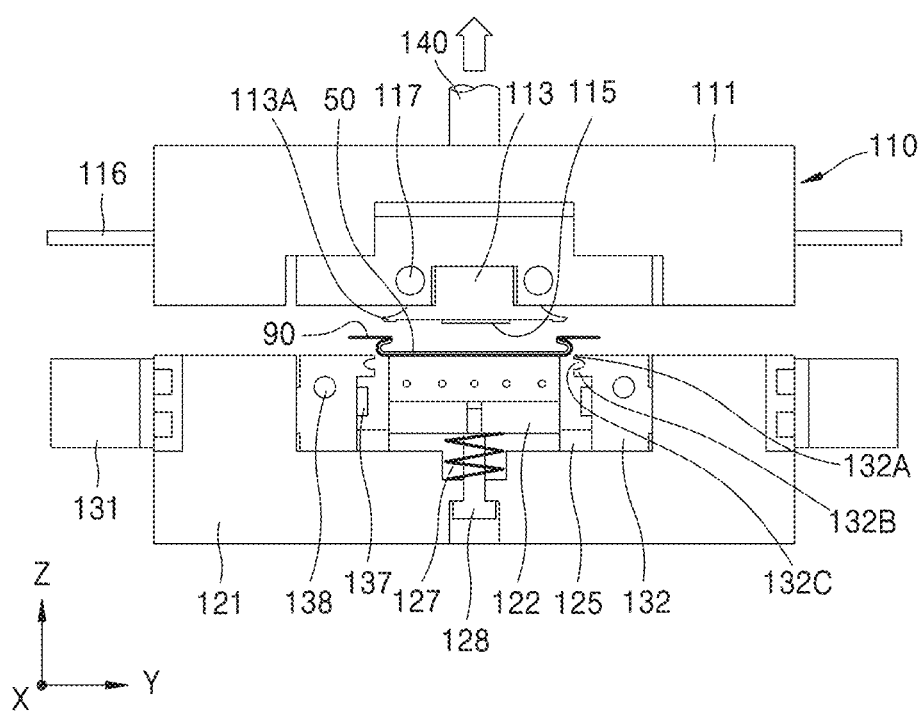

When the above process is completed, the driver 131 may operate in the reverse of the operation described with reference to FIG. 13. In an embodiment, the moving block 133 and the second pressing portion 132 may be linearly moved according to the operation of the driver 131. In such an embodiment, the second pressing portion 132 may be separated from the support member 50 and spaced apart from the support member 50 (see FIG. 14).

Then, the jig driver 140 may operate to space the first pressing portion 113 from the linear movement portion 122. In an embodiment, the suction hole 122A may be maintained in a substantially vacuum state, and thus, the film member 90 may be fixed to the linear movement portion 122. In such an embodiment, the outermost size of the support member 50 may be less than or equal to the width between first protrusions 132A, and thus, even when the first pressing portion 113 linearly moves as described above, the movement of the support member 50 may not be disturbed.

When the first pressing portion 113 operates as described above, the elastic portion 127 may provide a restoring force to the linear movement portion 122. When the first pressing portion 113 continues to linearly move, the linear movement portion 122 may reach an initial position. In such an embodiment, the linear movement portion 122 may no longer move with the movement of the first pressing portion 113 by the gap adjusting portion 128, and the support member 50 may maintain a state in which the support member 50 is fixed to the linear movement portion 122.

When the first pressing portion 113 continues the linear movement, the first pressing portion 113 may be separated from the support member 50. The first pressing portion 113 may be withdrawn from a bent portion of the support member 50. In such an embodiment, the bent portion of the support member 50 may have an elastic force and a restoring force to a predetermined extent, thereby maintaining a shape after molding even after the first pressing portion 113 is drawn out (see FIG. 13).

The support member 50 molded as described above may be carried out to the outside or transported to another device in a state in which the film member 90 is attached to the support member 50.

Figure 16:
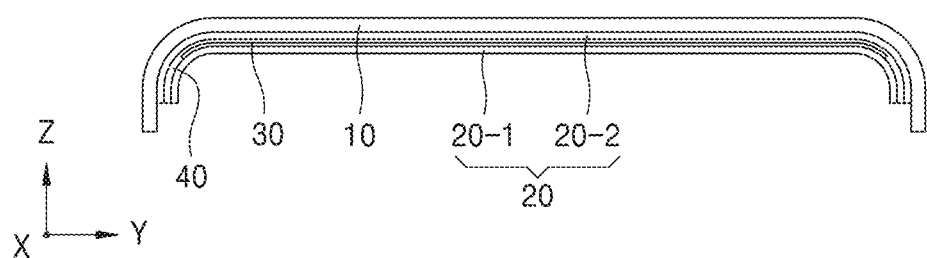
FIGS. 16 and 17 are cross-sectional views illustrating a method of manufacturing a display device according to an embodiment.
Figure 17:
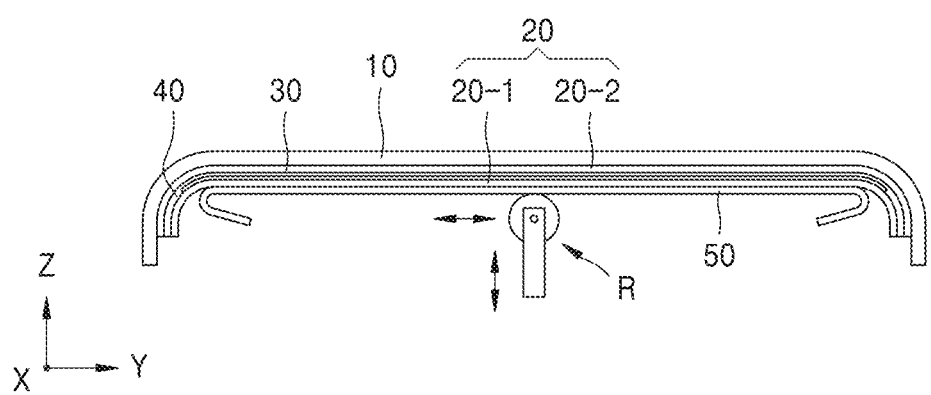

FIGS. 16 and 17 are cross-sectional views illustrating a method of manufacturing a display device according to an embodiment.

Referring to FIGS. 16 and 17, a cover member 10 and a panel member 20 may be coupled through a separate device. Then, the support member 50 manufactured according to the procedure of FIGS. 11 to 15 may be attached to the panel member 20. In such an embodiment, a film member 90 may be removed, and when the film member 90 is removed, an adhesive layer may be arranged on a surface of the support member 50.

The panel member 20 arranged on the cover member 10 and the support member 50 may be arranged to face each other. Then, the support member 50 may be pressed by a pressure roller R or the like on one surface of the support member 50. The pressure roller R may press the support member 50 toward the panel member 20 while moving from a portion (e.g., a central portion of the support member 50) of the support member 50 to a bent portion of the support member 50 or to the end of the support member 50. The pressure roller R may move in the Z-axis direction and/or the Y-axis direction of FIG. 16.

When the pressure roller R moves as described above, the bent portion of the support member 50 may be attached to the panel member 20 while unfolding.

When the support member 50 is attached to the panel member 20 in a state in which opposing ends of the support member 50 are not bent as described above, the support member 50 first may contact an end portion of the panel member 20 or bubbles may occur after the support member 50 is attached to the end of the panel member 20 and the central portion of the panel member 20.

If the support member 50 is attached to the panel member 20 in a flat state, an end portion of the panel member 20 may be arranged closer to the support member 50 than other portions of the panel member 20, and thus, the support member 50 may contact first the end of the panel member 20. In this case, even though the attachment between the support member 50 and the panel member 20 is started at the central portion of the support member 50 and then the support member 50 and the panel member 20 are attached together from the central portion of the support member 50 toward the end of the support member 50, bubbles may occur between the central portion of the support member 50 and the end of the support member 50. In addition, when the support member 50 is attached to the panel member 20 in a flat state, the support member 50 may be separated from the panel member 20 due to a restoring force of the support member 50, in a curved portion of the cover member 10, after the support member 50 is attached to the panel member.

In an embodiment, the support member 50 is attached to the panel member 20 in a state in which the end portion of the support member 50 is bent in advance as described above, such that the problem described above may be effectively prevented.

In such an embodiment, the radius of curvature of the end of the support member 50 may be less than the radius of curvature of the end of the cover member 10 and/or the radius of curvature of the end of the panel member 20, thereby preventing the end of the support member 50 from contacting the panel member 20 before a portion (e.g., a central portion) of the support member 50.

Therefore, the apparatus 100 for manufacturing a display device and a method of manufacturing a display device, according to embodiments, may reduce a failure rate when the support member 50 and the panel member 20 are attached to each other. In such embodiments, the apparatus 100 and the method may prevent the support member 50 from being separated from the panel member 20 at a curved portion of the cover member 10 when the support member 50 is fixed to the panel member 20.

Figure 18:
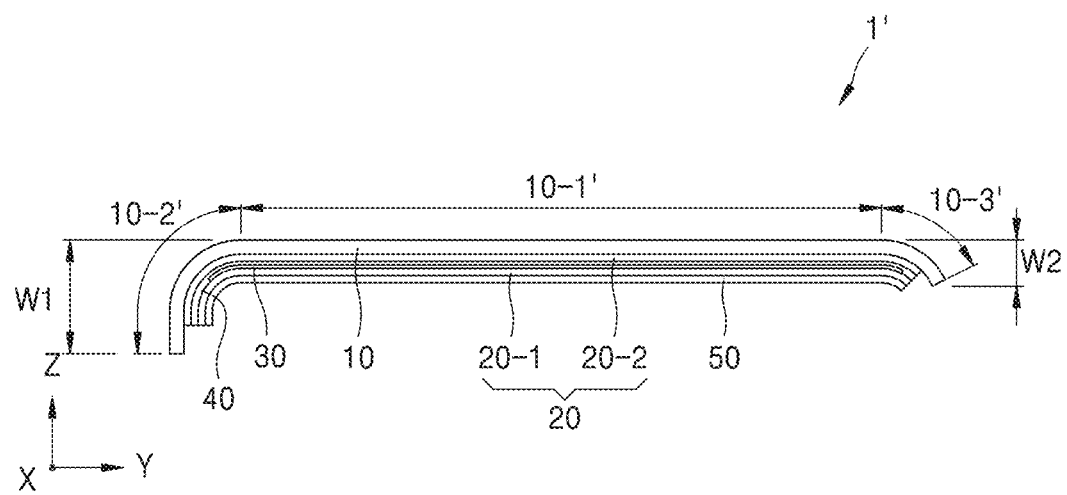
FIG. 18 is a cross-sectional view of a display device according to an alternative embodiment.

FIG. 18 is a cross-sectional view of a display device 1' according to an alternative embodiment.

Referring to FIG. 18, the display device 1' may include a cover member 10, a display panel 20-1, and a support member 50. The cover member 10, the display panel 20-1, and the support member 50 may be substantially the same as or similar to those described with reference to FIGS. 1A and 1B. Hereinafter, features of the cover member 10, the display panel 20-1 and the support member 50 different from those described above with reference to FIGS. 1A and 1B will be described in detail for convenience of description.

The cover member 10 may include a first region 10-1', a second region 10-2', and a third region 10-3'. At least a portion of the second region 10-2' and/or at least a portion of the third region 10-3' may be formed to be curved. In such an embodiment, the radius of curvature of a curved portion of the second region 10-2' may be different from that of a curved portion of the third region 10-3'. In one embodiment, for example, the radius of curvature of the curved portion of the second region 10-2' may be less or greater than that of the curved portion of the third region 10-3'. In an alternative embodiment, the radius of curvature of the curved portion of the second region 10-2' may be equal to that of the curved portion of the third region 10-3'. Hereinafter, for convenience of description, embodiments where the radius of curvature of the curved portion of the second region 10-2' is different from that of the curved portion of the third region 10-3' will be described in detail.

In such an embodiment, the length of the second region 10-2' and the length of the third region 10-3' may be different from each other. In one embodiment, for example, one of the length of the second region 10-2' and the length of the third region 10-3' may be less than the other of the length of the second region 10-2' and the length of the third region 10-3'. The length of the second region 10-2' may be the length of the outer surface of the second region 10-2', and the length of the third region 10-3' may be the length of the outer surface of the third region 10-3'.

In such an embodiment, the distance from the end of the second region 10-2' to one surface of the first region 10-1' may be different from the distance from the end of the third region 10-3' to the one surface of the first region 10-1'. In one embodiment, for example, a distance W1 from the end of the second region 10-2' to one surface of the first region 10-1' may be greater than a distance W2 from the end of the third region 10-3' to the one surface of the first region 10-1'. The distances may be measured based on the Z direction of FIG. 18.

In an embodiment, as described above, the position of the end of the panel member 20 and/or the position of the end of the support member 50 may be different from the position of the end of the cover member 10. In such an embodiment, as described above, the end of the panel member 20 and/or the end of the support member 50 may be arranged closer to the center of the cover member 10 than the end of the cover member 10.

Figure 19:
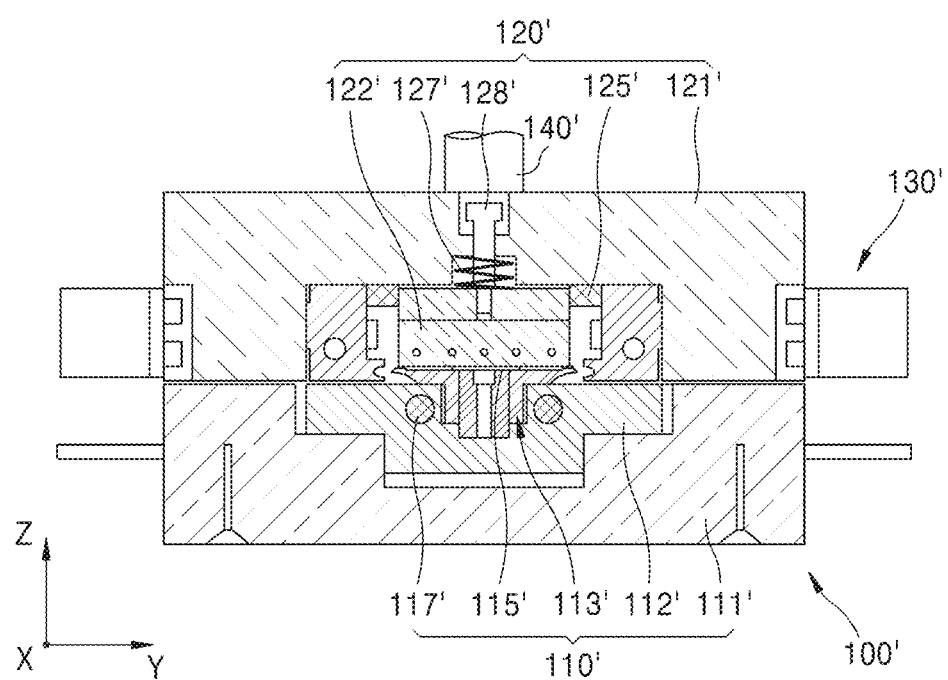
FIG. 19 is a cross-sectional view of an apparatus for manufacturing a display device, according to an alternative embodiment.

FIG. 19 is a cross-sectional view of an apparatus for manufacturing a display device according to an alternative embodiment.

Referring to FIG. 19, the apparatus 100' for manufacturing a display device may include a first jig portion 110', a second jig portion 120', a third jig portion 130', and a jig driver 140'. The first jig portion 110', the second jig portion 120', the third jig portion 130', and the jig driver 140' are substantially the same as or similar to those described with reference to FIG. 4, and thus, any detailed descriptions of the same or like elements thereof, e.g., first support portions 111' and 112', a first protrusion portion 115', a first temperature measuring portion 116' and a first heating portion 117' of the first jig portion 110' and a third guide portion 125', an elastic portion 127' and a gap adjusting portion 128' of the second jig portion 120', will be omitted.

The jig driver 140' may be connected to the second jig portion 120'. The second jig portion 120' may be arranged to face the first jig portion 110' and may be arranged above the first jig portion 110'. In such an embodiment, the second jig portion 120' may linearly move according to the operation of the jig driver 140'. The third jig portion 130' may linearly move together with the second jig portion 120' during the linear movement of the second jig portion 120'. In such an embodiment, the third jig portion 130' may bend opposing ends of a support member (not shown).

In the operation of the apparatus 100' for manufacturing a device, the support member to which a film member (not shown) is attached may be fixed to the second jig portion 120'. A method of fixing the support member to the second jig portion 120' is substantially the same as or similar to that described above, and thus, any repetitive detailed description thereof will be omitted.

When the support member is fixed to the second jig portion 120' as described above, the jig driver 140' may operate to dispose the second jig portion 120' closer to the first jig portion 110'. In such an embodiment, a first pressing portion 113' may press the support member, and opposing ends of the support member may be primarily bent while a linear movement portion 122' enters into a second support portion 121' by the first pressing portion 113'.

Then, the third jig portion 130' may operate to bend once again the opposing ends of the support member that is primarily bent. In such an embodiment, the opposing ends of the support member may be bent to have a greater angle than when the opposing ends of the support member are primarily bent.

When the jig driver 140' is driven opposite to the description above, the second jig portion 120' may move upward, and the bent support member may move together with the second jig portion 120', such that the support member may be separated from the first pressing portion 131'.

Then, after the support member bent at both ends thereof is withdrawn to the outside, the film member may be removed from the support member and then the support member may be attached to a panel member (not shown). In such an embodiment, the support member may be attached to the panel member as shown in FIG. 1, 16, or 18.

According to embodiments, a display device may have a curved portion, and each member may not be separated from one another in the curved portion. In addition, an apparatus and method of manufacturing a display device, according to the embodiments, may improve contact forces of members in a curved portion of a cover member.

It should be understood that embodiments described herein should be considered in a descriptive sense only and not for purposes of limitation, and descriptions of features or aspects within each embodiment should typically be considered as available for other similar features or aspects in other embodiments. The invention should not be construed as being limited to the embodiments set forth herein. Rather, these embodiments are provided so that this disclosure will be thorough and complete and will fully convey the concept of the invention to those skilled in the art.

While the invention have been described with reference to embodiments thereof, it will be understood by those of ordinary skill in the art that various changes in form and details may be made therein without departing from the spirit and scope of the invention as defined by the following claims.

What is claimed is:

1. A display device comprising:
a cover member which is at least partially bent;
a panel member arranged along a surface of the cover member, wherein the panel member displays an image; and
a support member arranged on another surface of the panel member different from the surface of the panel member on which the cover member is arranged, wherein the support member includes at least one selected from a cushion member, a heat dissipation member and a shielding member which shields external electric signals or electronic signals,
wherein the display device includes:
a first region which is flat; and
a second region connected to an end of the first region, wherein the second region is curved, and
wherein a length of a curved portion of the support member corresponding to the second region along a curved surface thereof is less than a length of a curved portion of the cover member corresponding to the second region along a curved surface thereof.

2. The display device of claim 1, wherein
the image displayed on the panel member is visible through the cover member.

3. The display device of claim 1, wherein
the display device further includes:
a third region connected to the first region and disposed opposite to the second region with respect to the first region.

4. The display device of claim 3, wherein
a shape of the second region is different from a shape of the third region.

5. The display device of claim 3, wherein
a distance from a surface of the first region to an end of the second region is different from a distance from the surface of the first region to an end of the third region.

6. The display device of claim 1, wherein
a position of an end of the cover member, a position of an end of the panel member, and a position of an end of the support member are different from one another.

7. The display device of claim 1, wherein
the panel member is flexible.

8. The display device of claim 1, wherein
the display device has a long side and a short side in a plan view.

9. The display device of claim 8, wherein
the curved portion of the cover member is defined in a portion extending along the long side of the display device.

10. An apparatus for manufacturing a display device, the apparatus comprising:
a first jig portion including:
 a first support portion; and
 a first pressing portion arranged at the first support portion, wherein the first pressing portion presses a support member;
a second jig portion including a linear movement portion arranged to correspond to the first pressing portion, wherein the linear movement portion linearly moves, and wherein the second jig portion faces the first jig portion and the support member is seated on the second jig portion; and
a third jig portion arranged on a side surface of the second jig portion to press a side surface of the support member when the support member is molded,
wherein at least one of the first jig portion and the second jig portion linearly moves, and
wherein the linear movement portion linearly moves together with the first pressing portion when at least one of the first jig portion and the second jig portion linearly moves.

11. The apparatus of claim 10, wherein
the first jig portion further includes a first protrusion portion arranged at the first pressing portion and protruding toward the second jig portion.

12. The apparatus of claim 10, wherein
the first pressing portion includes:
a pressing body portion connected to the first support portion; and
a protrusion portion protruding from the pressing body portion toward a side surface of the pressing body portion.

13. The apparatus of claim 10, wherein
the first jig portion further includes a first heating portion arranged inside the first support portion.

14. The apparatus of claim 13, wherein
the first jig portion further includes a first temperature measuring portion arranged inside the first support portion to measure a temperature of the first support portion.

15. The apparatus of claim 10, wherein
the first jig portion further includes a first guide portion arranged at the first support portion.

16. The apparatus of claim 15, wherein
the second jig portion further includes a second guide portion arranged to correspond to the first guide portion to guide a movement of the first jig portion.

17. The apparatus of claim 10, wherein
the second jig portion further includes a second support portion in which the linear movement portion linearly moves.

18. The apparatus of claim 10, wherein
the second jig portion further includes a third guide portion which guides a movement of the third jig portion.

19. The apparatus of claim 10, wherein
the second jig portion further includes an elastic portion which provides a restoring force to the linear movement portion during a movement of the linear movement portion.

20. The apparatus of claim 10, wherein
the third jig portion includes a second pressing portion which linearly moves in the second jig portion to press the side surface of the support member.

21. The apparatus of claim 20, wherein
the second pressing portion includes a curved portion which bends at least a portion of the support member.

22. The apparatus of claim 20, wherein
the third jig portion further includes a driver connected to the second pressing portion to linearly move the second pressing portion.

23. The apparatus of claim 22, wherein
the third jig portion further includes a heat insulating member arranged between the driver and the second pressing portion.

24. The apparatus of claim 23, wherein
the third jig portion further includes a second temperature measuring portion arranged inside the second pressing portion.

25. The apparatus of claim 20, wherein
the third jig portion further includes a second heating portion arranged inside the second pressing portion.

26. The apparatus of claim 20, wherein
the third jig portion further includes a second protrusion portion arranged at the second pressing portion to maintain a distance between the third jig portion and the second jig portion.

\* \* \* \* \*